United States Patent
Miyazaki et al.

(10) Patent No.: US 10,756,768 B2
(45) Date of Patent: Aug. 25, 2020

(54) RADIO-FREQUENCY FRONT-END CIRCUIT AND COMMUNICATION DEVICE

(71) Applicant: Murata Manufacturing Co., Ltd., Nagaokakyo-shi, Kyoto-fu (JP)

(72) Inventors: Daisuke Miyazaki, Nagaokakyo (JP); Morio Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/360,248

(22) Filed: Mar. 21, 2019

(65) Prior Publication Data
US 2019/0222236 A1 Jul. 18, 2019

Related U.S. Application Data

(63) Continuation of application No. PCT/JP2017/035065, filed on Sep. 27, 2017.

(30) Foreign Application Priority Data

Sep. 30, 2016 (JP) ................................. 2016-194875

(51) Int. Cl.
*H04B 1/00* (2006.01)
*H04B 1/40* (2015.01)
(Continued)

(52) U.S. Cl.
CPC ............. *H04B 1/006* (2013.01); *H03H 9/706* (2013.01); *H03H 9/725* (2013.01); *H04B 1/00* (2013.01);
(Continued)

(58) Field of Classification Search
CPC . H04B 1/006; H04B 1/40; H04B 1/00; H04B 1/0057; H04B 1/0075; H04B 1/16; H03H 9/725; H03H 9/706
See application file for complete search history.

(56) References Cited

U.S. PATENT DOCUMENTS

2007/0191055 A1* 8/2007 Kovacs .................... H04B 1/18
455/552.1
2010/0074240 A1 3/2010 Jian et al.
(Continued)

FOREIGN PATENT DOCUMENTS

JP 2007-511145 A 4/2007
JP 2012-503916 A 2/2012
(Continued)

OTHER PUBLICATIONS

Official Communication issued in International Patent Application No. PCT/JP2017/035065, dated Dec. 19 2017.

*Primary Examiner* — Dong-Chang Shiue
(74) *Attorney, Agent, or Firm* — Keating & Bennett, LLP

(57) ABSTRACT

A radio-frequency front-end circuit includes first and second filters, and first and second band elimination filters. The first filter is connected between an antenna common terminal and a first input-output terminal, and has a first frequency band as a pass band. The second filter is connected between the antenna common terminal and a second input-output terminal, and has a second frequency band as a pass band. The first band elimination filter is connected between the antenna common terminal and a third input-output terminal, and has the first frequency band as a stop band. The second band elimination filter is connected in series with the first band elimination filter between the antenna common terminal and the third input-output terminal, and has the second frequency band as a stop band.

23 Claims, 17 Drawing Sheets

(51) Int. Cl.
    *H04B 1/16*         (2006.01)
    *H03H 9/70*         (2006.01)
    *H03H 9/72*         (2006.01)

(52) U.S. Cl.
    CPC ......... *H04B 1/0057* (2013.01); *H04B 1/0075* (2013.01); *H04B 1/16* (2013.01); *H04B 1/40* (2013.01)

(56) References Cited

U.S. PATENT DOCUMENTS

| | | | |
|---|---|---|---|
| 2012/0201174 A1* | 8/2012 | Jian | H04B 1/0057 370/278 |
| 2013/0285768 A1 | 10/2013 | Watanabe et al. | |
| 2015/0244347 A1 | 8/2015 | Feng et al. | |
| 2017/0201369 A1* | 7/2017 | Ella; Juha | H03H 9/706 |
| 2017/0294897 A1* | 10/2017 | Kanazawa | H03H 9/25 |
| 2019/0273521 A1* | 9/2019 | Nishikawa | H05K 1/0243 |

FOREIGN PATENT DOCUMENTS

| | | |
|---|---|---|
| JP | 2015-162905 A | 9/2015 |
| WO | 2012/086639 A1 | 6/2012 |
| WO | 2016/111262 A1 | 7/2016 |

\* cited by examiner

| FIRST BAND ELIMINATION FILTER 11B | SECOND BAND ELIMINATION FILTER 12B |
|---|---|
| USE LN RAYLEIGH WAVES | SMR |
| | FBAR |
| USE LT LEAKY WAVES | SMR |
| | FBAR |
| USE LN LOVE WAVES | SMR |
| | FBAR |
| ACOUSTIC VELOCITY FILM MULTILAYER STRUCTURE | SMR |
| | FBAR |

RL AT LOW FREQUENCIES 1 < RL AT LOW FREQUENCIES 1

FIG. 13A

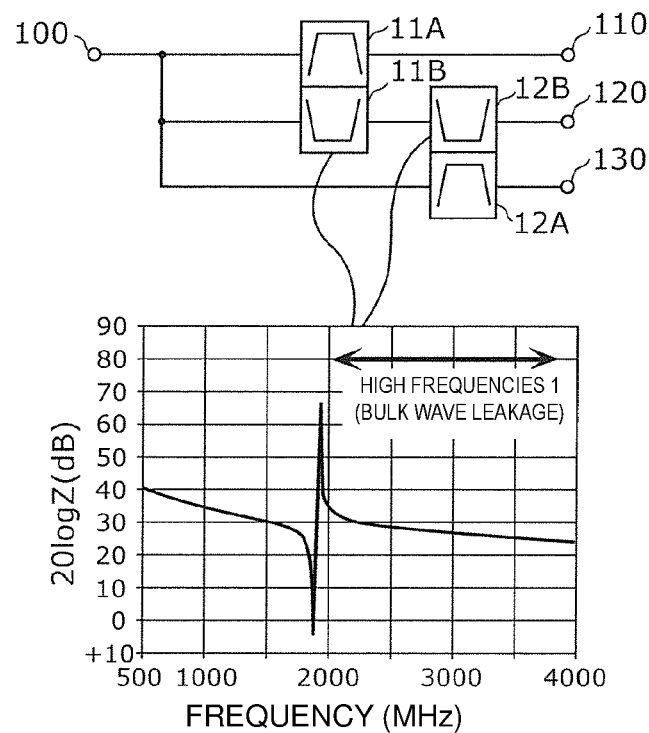

FIG. 13B

| FIRST BAND ELIMINATION FILTER 11B | SECOND BAND ELIMINATION FILTER 12B |
|---|---|
| USE LN RAYLEIGH WAVES | ACOUSTIC VELOCITY FILM MULTILAYER STRUCTURE |
|  | USE LT LEAKY WAVES |
|  | USE LN LOVE WAVES |
| ACOUSTIC VELOCITY FILM MULTILAYER STRUCTURE | USE LT LEAKY WAVES |
|  | USE LN LOVE WAVES |
| USE LT LEAKY WAVES | USE LN LOVE WAVES |
| SMR | ACOUSTIC VELOCITY FILM MULTILAYER STRUCTURE |
|  | USE LT LEAKY WAVES |
|  | USE LN LOVE WAVES |
| FBAR | ACOUSTIC VELOCITY FILM MULTILAYER STRUCTURE |
|  | USE LT LEAKY WAVES |
|  | USE LN LOVE WAVES |

RL AT HIGH FREQUENCIES 1 < RL AT HIGH FREQUENCIES 1

| FIRST BAND ELIMINATION FILTER 11B | SECOND BAND ELIMINATION FILTER 12B |
|---|---|
| USE LN RAYLEIGH WAVES | ACOUSTIC VELOCITY FILM MULTILAYER STRUCTURE |
| USE LT LEAKY WAVES | |
| USE LN LOVE WAVES | |
| SMR | |
| FBAR | |
| USE LN RAYLEIGH WAVES | USE LT LEAKY WAVES |
| ACOUSTIC VELOCITY FILM MULTILAYER STRUCTURE | |
| USE LN LOVE WAVES | |
| SMR | |
| FBAR | |

RL AT LOW FREQUENCIES 2 < RL AT LOW FREQUENCIES 2

| FIRST BAND ELIMINATION FILTER 11B | SECOND BAND ELIMINATION FILTER 12B |
|---|---|
| ACOUSTIC VELOCITY FILM MULTILAYER STRUCTURE | USE LN RAYLEIGH WAVES |
| USE LT LEAKY WAVES | |
| USE LN LOVE WAVES | |
| SMR | |
| FBAR | |
| USE LN RAYLEIGH WAVES | USE LN LOVE WAVES |
| ACOUSTIC VELOCITY FILM MULTILAYER STRUCTURE | |
| USE LT LEAKY WAVES | |
| SMR | |
| FBAR | |

RL AT HIGH FREQUENCIES 2 < RL AT HIGH FREQUENCIES 2

| FIRST BAND ELIMINATION FILTER 11B | SECOND BAND ELIMINATION FILTER 12B |
|---|---|
| USE LN RAYLEIGH WAVES | ACOUSTIC VELOCITY FILM MULTILAYER STRUCTURE |
| | USE LT LEAKY WAVES |
| | USE LN LOVE WAVES |
| | SMR |
| | FBAR |
| ACOUSTIC VELOCITY FILM MULTILAYER STRUCTURE | USE LT LEAKY WAVES |
| | USE LN LOVE WAVES |
| | SMR |
| | FBAR |

RL AT LOW FREQUENCIES 3 < RL AT LOW FREQUENCIES 3
RL AT HIGH FREQUENCIES 3 < RL AT HIGH FREQUENCIES 3

| FIRST BAND ELIMINATION FILTER 11B | SECOND BAND ELIMINATION FILTER 12B |
|---|---|
| USE LN RAYLEIGH WAVES | ACOUSTIC VELOCITY FILM MULTILAYER STRUCTURE |
| USE LN RAYLEIGH WAVES | USE LT LEAKY WAVES |
| ACOUSTIC VELOCITY FILM MULTILAYER STRUCTURE | |

RL AT LOW FREQUENCIES 4 < RL AT LOW FREQUENCIES 4
RL AT HIGH FREQUENCIES 4 < RL AT HIGH FREQUENCIES 4

FIG. 18A

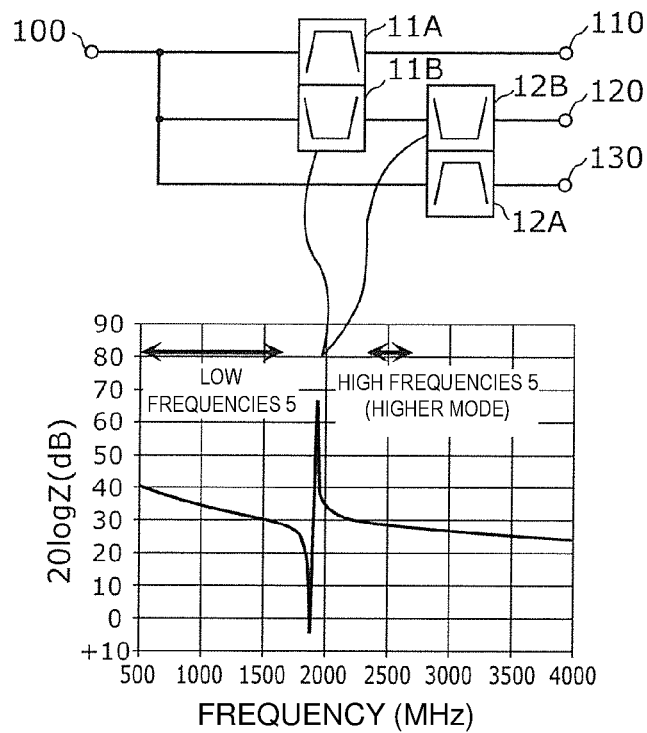

FIG. 18B

| FIRST BAND ELIMINATION FILTER 11B | SECOND BAND ELIMINATION FILTER 12B |
|---|---|
| ACOUSTIC VELOCITY FILM MULTILAYER STRUCTURE | USE LN RAYLEIGH WAVES |
| USE LT LEAKY WAVES | |
| USE LN LOVE WAVES | |
| USE LN RAYLEIGH WAVES | USE LN LOVE WAVES |
| ACOUSTIC VELOCITY FILM MULTILAYER STRUCTURE | |
| USE LT LEAKY WAVES | |

RL AT LOW FREQUENCIES 5 < RL AT LOW FREQUENCIES 5
RL AT HIGH FREQUENCIES 5 < RL AT HIGH FREQUENCIES 5

FIG. 19A

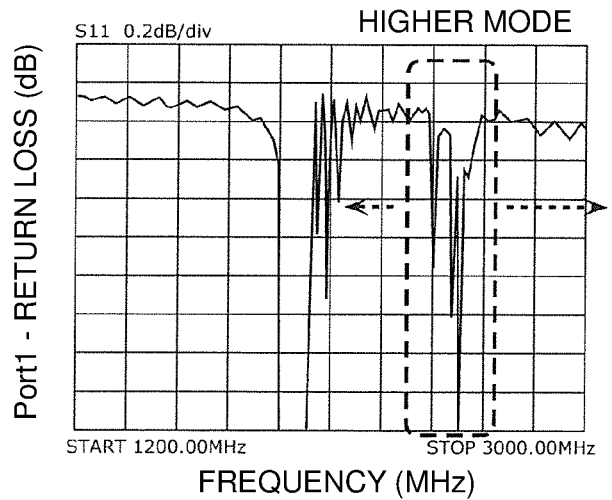

FIG. 19B

| ELASTIC WAVE MODE | STRUCTURE PARAMETER |
|---|---|
| USE LT LEAKY WAVES | IDT ELECTRODE FILM THICKNESS |
| | Duty |
| ACOUSTIC VELOCITY FILM MULTILAYER STRUCTURE | IDT ELECTRODE FILM THICKNESS |
| | Duty |
| | LOW ACOUSTIC VELOCITY FILM |

RAYLEIGH WAVE SPURIOUS

FIG. 19C

| ELASTIC WAVE MODE | STRUCTURE PARAMETER |
|---|---|
| USE LN RAYLEIGH WAVES | IDT ELECTRODE FILM THICKNESS |
| | PROTECTIVE FILM |
| | Duty |
| USE LN LOVE WAVES | IDT ELECTRODE FILM THICKNESS |
| | PROTECTIVE FILM |
| | Duty |
| ACOUSTIC VELOCITY FILM MULTILAYER STRUCTURE | LT FILM THICKNESS |
| | LOW ACOUSTIC VELOCITY FILM |
| | Si CRYSTAL ORIENTATION |

HIGHER MODE

FIG. 20

| ELASTIC WAVE MODE | STRUCTURE PARAMETER |
|---|---|
| USE LT LEAKY WAVES | IDT ELECTRODE FILM THICKNESS |
| USE LN LOVE WAVES | IDT ELECTRODE FILM THICKNESS |

BULK WAVES

RADIO-FREQUENCY FRONT-END CIRCUIT AND COMMUNICATION DEVICE

CROSS REFERENCE TO RELATED
APPLICATIONS

This application claims the benefit of priority to Japanese Patent Application No. 2016-194875 filed on Sep. 30, 2016 and is a Continuation Application of PCT Application No. PCT/JP2017/035065 filed on Sep. 27, 2017. The entire contents of each application are hereby incorporated herein by reference.

BACKGROUND OF THE INVENTION

1. Field of the Invention

The present invention relates to a radio-frequency front-end circuit and a communication device.

2. Description of the Related Art

In recent years, cellular phones are required to support multiple frequencies and multiple wireless modes by one terminal (multiband and multimode support). Front-end modules that support multiple bands and multiple modes are desired to process a plurality of transmission and reception signals at high speed without degradation of quality. In particular, front-end modules are desired to perform carrier aggregation for transmitting and receiving multiband radio-frequency signals at the same time.

FIG. 21 is a circuit configuration diagram of a conventional electric circuit described in Japanese Unexamined Patent Application Publication No. 2007-511145. The electric circuit shown in the diagram is a front-end filter circuit that is connected to an antenna, and includes extraction filter circuits 501, 502. The extraction filter circuit 501 includes a band pass filter 501A and a band stop filter 501B. The extraction filter circuit 502 includes a band pass filter 502A and a band stop filter 502B. A first signal path includes an input terminal In, the band pass filter 501A, and an output terminal Out1. The first signal path passes, for example, a GPS signal. A second signal path includes the input terminal In, the band stop filter 501B, the band pass filter 502A, and an output terminal Out2. The second signal path passes, for example, a WLAN signal. A third signal path includes the input terminal In, the band stop filter 501B, the band stop filter 502B, and an output terminal Out3. The third signal path passes a signal other than the GPS signal or the WLAN signal. That is, since the extraction filter circuit 501 and the extraction filter circuit 502 are connected to each other in a cascade arrangement, three demultiplexed signals are output in a stage subsequent to these two circuits. The three demultiplexed signals include signals in two frequency bands (GPS and WLAN) and a signal in a frequency band other than the two frequency bands.

As described above, the filter circuit described in Japanese Unexamined Patent Application Publication No. 2007-511145 is able to demultiplex a signal into signals in the two frequency bands (for example, GPS and WLAN) and a signal in the frequency band other than the two frequency bands and output the three demultiplexed signals. However, since the band pass filter 501A and the band stop filter 501B are connected in common to the input terminal In, the band stop filter 501B is affected by the band pass filter 501A, with the result that the filter characteristics deteriorate. In addition, the band pass filter 502A and the band stop filter 502B are connected in common to an output terminal of the band stop filter 501B, the band stop filter 502B is affected by the band pass filter 502A, with the result that the filter characteristics deteriorate. Furthermore, when focusing on the second signal path, since a radio-frequency signal input from the input terminal In also passes through the band stop filter 501B in a stage preceding to passage through the band pass filter 502A, the insertion loss increases and the propagation characteristics deteriorate as compared to when a radio-frequency signal passes through a single band pass filter. When the filter circuit described in Japanese Unexamined Patent Application Publication No. 2007-511145 is used to support a system for a further increased number of bands, the number of band stop filters to be added to a stage preceding to a band pass filter increases, so it is difficult to respond to a request for miniaturization of radio-frequency front-end modules in recent years.

SUMMARY OF THE INVENTION

Preferred embodiments of the present invention provide small radio-frequency front-end circuits and communication devices that each maintain low-loss signal propagation characteristics.

A radio-frequency front-end circuit according to a preferred embodiment of the present invention includes an antenna common terminal, a first input-output terminal, a second input-output terminal, a third input-output terminal, a first filter, a second filter, a first band elimination filter, and a second band elimination filter. The antenna common terminal is connected to an antenna element. The first filter is connected between the antenna common terminal and the first input-output terminal. The first filter has a frequency band, including a first frequency band, as a pass band. The second filter is connected between the antenna common terminal and the second input-output terminal. The second filter has a frequency band, including a second frequency band different from the first frequency band, as a pass band. The first band elimination filter is connected between the antenna common terminal and the third input-output terminal. The first band elimination filter has a frequency band, including the first frequency band and not including a third frequency band different from the first frequency band or the second frequency band, as a stop band. The second band elimination filter is connected in series with the first band elimination filter between the antenna common terminal and the third input-output terminal. The second band elimination filter has a frequency band, including the second frequency band and not including the third frequency band, as a stop band. The first filter is connected to the antenna common terminal and the first input-output terminal, but not connected to the antenna common terminal by the first band elimination filter or the second band elimination filter. The second filter is connected to the antenna common terminal and the second input-output terminal, but not connected to the antenna common terminal by the first band elimination filter or the second band elimination filter.

With the above configuration, the filter having the third frequency band as a pass band is defined by the two band elimination filters connected in series with each other. Since the second filter and the second band elimination filter are not connected in common to the antenna terminal and are electrically independent of each other, the second band elimination filter is not affected by the second filter. Thus, in a signal path that propagates a radio-frequency signal of the third frequency band, the insertion loss in the pass band is reduced as compared to when the second filter and the second band elimination filter are not electrically independent of each other.

In a signal path that propagates a radio-frequency signal of the first frequency band, a signal passes through only the first filter, but not by any band elimination filter. In a signal path that propagates a radio-frequency signal of the second frequency band, a signal passes through only the second filter, but not by any band elimination filter. That is, a signal that passes through the second input-output terminal passes through only the second filter electrically independent of the second band elimination filter, so the insertion loss is reduced.

Of the two band elimination filters, the first band elimination filter is a filter having the first frequency band as a stop band. Therefore, in manufacturing the first band elimination filter, desired parameters of each elastic wave resonator of the first filter having the first frequency band as a pass band are applicable, and a similar manufacturing process to that of the first filter is applicable. Furthermore, each elastic wave resonator of the first filter may also be used. Of the two band elimination filters, the second band elimination filter is a filter having the second frequency band as a stop band. Therefore, in manufacturing the second band elimination filter, desired parameters of each elastic wave resonator of the second filter having the second frequency band as a pass band are applicable, and a similar manufacturing process to that of the second filter is applicable. Furthermore, each elastic wave resonator of the second filter may also be used. Thus, in a multiplexer circuit, band pass filters do not need to be provided in a number equivalent to the number of frequency bands, so simplification of manufacturing process and miniaturization are achieved.

The first filter and the first band elimination filter may be provided in the same chip. The second filter and the second band elimination filter may be provided in the same chip.

As described above, in manufacturing the first band elimination filter, desired parameters of each elastic wave resonator of the first filter having the first frequency band as a pass band are applicable, and a similar manufacturing process to that of the first filter is applicable. Furthermore, each elastic wave resonator of the first filter may also be used. In manufacturing the second band elimination filter, desired parameters of each elastic wave resonator of the second filter having the second frequency band as a pass band are applicable, and a similar manufacturing process to that of the second filter is applicable. Furthermore, each elastic wave resonator of the second filter may also be used. Thus, the first filter and the first band elimination filter are easily provided in the same chip, and the second filter and the second band elimination filter are easily provided in the same chip. As a result, further simplification of manufacturing process and miniaturization are possible.

The first filter and the first band elimination filter may be provided in a first chip. The second filter and the second band elimination filter may be provided in a second chip. The first filter, the first band elimination filter, the second filter, and the second band elimination filter each may include one or more elastic wave resonators. The first chip may be defined by only any one of a surface acoustic wave filter and an elastic wave filter using bulk acoustic waves (BAW). The second chip may be defined by only any one of a surface acoustic wave filter and an elastic wave filter using BAW.

Thus, a BAW filter that advantageously ensures a large reflection coefficient and a surface acoustic wave (SAW) filter having high flexibility of band width are able to be selectively manufactured on a chip-by-chip basis. Therefore, each of the first filter and the second filter is able to be selectively manufactured for SAW or BAW in conformity with requirement specifications of a radio-frequency signal that passes through the first frequency band or the second frequency band, so the flexibility of design improves.

The first band elimination filter and the second band elimination filter may be connected in order of the antenna common terminal, the first band elimination filter, the second band elimination filter, and the third input-output terminal. A reflection coefficient of the first band elimination filter in the first frequency band when the first band elimination filter is viewed from the antenna common terminal side alone may be larger than a reflection coefficient of the second band elimination filter in the second frequency band when the second band elimination filter is viewed from the antenna common terminal side alone.

In the case of the configuration that the first filter, the second filter, and the first band elimination filter and second band elimination filter included in a multiplexer-demultiplexer circuit are connected in common to the antenna common terminal, the insertion loss of the first filter in the pass band is affected by the reflection characteristics of the first band elimination filter when the first band elimination filter is viewed from the antenna common terminal side in addition to the insertion loss of the first filter alone. The insertion loss of the second filter in the pass band is affected by the reflection characteristics of the second band elimination filter when the second band elimination filter is viewed from the antenna common terminal side in addition to the insertion loss of the second filter alone. More specifically, the insertion loss of the first filter in the pass band reduces as the reflection coefficient of the first band elimination filter in the first frequency band when the first band elimination filter is viewed from the antenna common terminal side increases, and the insertion loss of the second filter in the pass band reduces as the reflection coefficient of the second band elimination filter in the second frequency band when the second band elimination filter is viewed from the antenna common terminal side increases (hereinafter, a loss due to the fact that not all signals are reflected in a stop band at a common terminal is termed binding loss).

Since the first band elimination filter is connected closer to the antenna common terminal than the second band elimination filter, the binding loss of the first filter due to the first band elimination filter is larger than the binding loss of the second filter due to the second band elimination filter. Therefore, the reflection coefficient of the first band elimination filter in the first frequency band is made larger than the reflection coefficient of the second band elimination filter in the second frequency band.

Thus, since the binding loss of each of the first filter and the second filter is effectively reduced without disposing a switch between the antenna element and each of the first filter and the second filter, a small radio-frequency front-end circuit that is able to maintain low-loss signal propagation characteristics even during CA operation is provided.

In ascending order of frequency, the third frequency band, the first frequency band, and the second frequency band may be allocated. The first band elimination filter and the second band elimination filter may define a low pass filter having a frequency band, including the third frequency band, as a pass band.

Thus, a filter that passes the third frequency band having the lowest frequencies is defined by the first band elimination filter and the second band elimination filter. Furthermore, since the filter that passes the third frequency band is provided by the low pass filter, the third frequency band is widened.

The third frequency band may be a middle low band (MLB: about 1475.9 MHz-about 2025 MHz). The first frequency band may be a middle band (MB: about 2110 MHz-about 2200 MHz). The second frequency band may be a high band (HB: about 2496 MHz-about 2690 MHz). The first filter may be a band pass filter having Band66 (reception band: about 2110 MHz-about 2200 MHz) of long term evolution (LTE) as a pass band. The second filter may be a band pass filter having Band41 (reception band: about 2496 MHz-about 2690 MHz) of LTE as a pass band. The first band elimination filter and the second band elimination filter may define a low pass filter having Band3 (reception band: about 1805 MHz-about 1880 MHz) as a pass band.

Thus, the radio-frequency front-end circuit may be applied to, for example, a three-way demultiplexer circuit that supports a middle low band, a middle band, and a high band. Thus, in the configuration including a three-way demultiplexer circuit that supports a middle low band, a middle band, and a high band, a small radio-frequency front-end circuit that is able to maintain low-loss signal propagation characteristics is achieved.

The third frequency band may lie at lower frequencies than the first frequency band and the second frequency band. Each of the first band elimination filter and the second band elimination filter may include one or more elastic wave resonators. The first band elimination filter may be structured to include any one of (1) Rayleigh waves that propagate through a piezoelectric layer made of $LiNbO_3$ are used as surface acoustic waves, (2) each elastic wave resonator is a solidly mounted resonator (SMR), and (3) each elastic wave resonator is a film bulk acoustic resonator (FBAR).

Unnecessary waves due to bulk wave leakage are generated in a higher frequency range than the resonance point and antiresonance point of each elastic wave resonator, and the unnecessary wave strength is reduced most when any one of the configuration that Rayleigh waves that propagate through a piezoelectric layer made of $LiNbO_3$ are used as surface acoustic waves, the configuration that each elastic wave resonator is an SMR, and the configuration that each elastic wave resonator is an FBAR.

Thus, when the series connection circuit defined by the first band elimination filter and the second band elimination filter is a lower frequency filter and the first filter and the second filter are higher frequency filters, the reflection coefficient of the first band elimination filter in the second frequency band in the case where the first band elimination filter uses elastic waves of any one of the above-described (1), (2), and (3) is larger than the reflection coefficient in the case where the first band elimination filter uses other elastic waves. Thus, the binding loss of the second filter is reduced.

The second band elimination filter may be structured to include any one of (1) each elastic wave resonator has an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (2) leaky waves that propagate through a piezoelectric layer made of $LiTaO_3$ are used as surface acoustic waves, and (3) Love waves that propagate through a piezoelectric layer made of $LiNbO_3$ are used as surface acoustic waves.

With this configuration, while the reflection coefficient of the first band elimination filter is increased, good temperature characteristics of the second band elimination filter are ensured when the second band elimination filter has the acoustic velocity film multilayer structure, and a wide stop band width of the second band elimination filter is ensured when the second band elimination filter uses Love waves on $LiNbO_3$ as surface acoustic waves.

The third frequency band may lie at lower frequencies than the first frequency band and the second frequency band. Each of the first band elimination filter and the second band elimination filter may include one or more elastic wave resonators. Each of the elastic wave resonators of each of the first band elimination filter and the second band elimination filter may be a surface acoustic wave resonator defined by a substrate including a piezoelectric layer, and an IDT electrode provided on the substrate. Each elastic wave resonator of the first band elimination filter may have an acoustic velocity film multilayer structure defined by the piezoelectric layer on one of principal surfaces of which the IDT electrode is defined, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer. The second band elimination filter may be configured as (1) leaky waves that propagate through the piezoelectric layer made of $LiTaO_3$ are used as surface acoustic waves or (2) Love waves that propagate through the piezoelectric layer made of $LiNbO_3$ are used as surface acoustic waves.

In a higher frequency range than the resonance point and antiresonance point of each elastic wave resonator, unnecessary waves due to bulk wave leakage are generated, and the unnecessary wave strength in the case where the acoustic velocity film multilayer structure is provided is smaller than the unnecessary wave strength in the case where leaky waves on $LiTaO_3$ are used as surface acoustic waves or Love waves on $LiNbO_3$ are used as surface acoustic waves.

Thus, when the series connection circuit defined by the first band elimination filter and the second band elimination filter is a lower frequency filter and the first filter and the second filter are higher frequency filters, the reflection coefficient of the first band elimination filter in the second frequency band in the case where the first band elimination filter has the acoustic velocity film multilayer structure is larger than the reflection coefficient in the case where the first band elimination filter has another structure. Thus, the binding loss of the second filter is reduced.

Furthermore, when the second band elimination filter uses Love waves on $LiNbO_3$ as surface acoustic waves, a wide stop band width is ensured.

The third frequency band may lie at lower frequencies than the first frequency band and the second frequency band. Each of the first band elimination filter and the second band elimination filter may include one or more elastic wave resonators. Each of the elastic wave resonators that define each of the first band elimination filter and the second band elimination filter may be a surface acoustic wave resonator defined by a substrate including a piezoelectric layer, and an IDT electrode provided on the substrate. The first band elimination filter may be configured to use leaky waves that propagate through the piezoelectric layer made of LiTaO$_3$ as surface acoustic waves. The second band elimination filter may be configured to use Love waves that propagate through the piezoelectric layer made of LiNbO$_3$ as surface acoustic waves.

In a higher frequency range than the resonance point and antiresonance point of each elastic wave resonator, unnecessary waves due to bulk wave leakage are generated, and the unnecessary wave strength in the case where leaky waves on LiTaO$_3$ are used as surface acoustic waves is smaller than the unnecessary wave strength in the case where Love waves on LiNbO$_3$ are used as surface acoustic waves.

Thus, when the series connection circuit defined by the first band elimination filter and the second band elimination filter is a lower frequency filter and the first filter and the second filter are higher frequency filters, the reflection coefficient of the first band elimination filter in the second frequency band in the case where the first band elimination filter uses leaky waves that propagate through the piezoelectric layer made of LiTaO$_3$ as surface acoustic waves is larger than the reflection coefficient in the case where the first band elimination filter uses Love waves that propagate through the piezoelectric layer made of LiNbO$_3$ as surface acoustic waves. Thus, the binding loss of the second filter is reduced. Furthermore, when the second band elimination filter uses Love waves on LiNbO$_3$ as surface acoustic waves, a wide stop band width is ensured.

The third frequency band may lie at lower frequencies than the first frequency band and the second frequency band. Each of the first band elimination filter and the second band elimination filter may include one or more elastic wave resonators. The first band elimination filter may be structured to include any one of (1) each elastic wave resonator has an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (2) leaky waves that propagate through a piezoelectric layer made of LiTaO$_3$ are used as surface acoustic waves, (3) Love waves that propagate through a piezoelectric layer made of LiNbO$_3$ are used as surface acoustic waves, (4) each elastic wave resonator is an SMR, and (5) each elastic wave resonator is an FBAR. The second band elimination filter may be structured to use Rayleigh waves that propagate through a piezoelectric layer made of LiNbO$_3$ as surface acoustic waves.

When Rayleigh waves on LiNbO$_3$ are used as elastic waves, a higher mode appears around 1.2 times of the resonant frequency of each elastic wave resonator. Thus, when the second band elimination filter uses Rayleigh waves on LiNbO$_3$ as elastic waves and the first band elimination filter does not use Rayleigh waves on LiNbO$_3$ as elastic waves, the reflection coefficient of the first band elimination filter in the second frequency band is effectively increased.

Thus, when the series connection circuit defined by the first band elimination filter and the second band elimination filter is a lower frequency filter and the first filter and the second filter are higher frequency filters, the binding loss of the second filter is reduced.

The third frequency band may be located at lower frequencies than the first frequency band and the second frequency band. Each of the first band elimination filter and the second band elimination filter may include one or more elastic wave resonators. The first band elimination filter may be structured to include any one of (1) Rayleigh waves that propagate through a piezoelectric layer made of LiNbO$_3$ are used as surface acoustic waves, (2) each elastic wave resonator has an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (3) leaky waves that propagate through a piezoelectric layer made of LiTaO$_3$ are used as surface acoustic waves, (4) each elastic wave resonator is an SMR, and (5) each elastic wave resonator is an FBAR. The second band elimination filter may be structured to use Love waves that propagate through a piezoelectric layer made of LiNbO$_3$ as surface acoustic waves.

When Love waves on LiNbO$_3$ are used as elastic waves, a higher mode appears around 1.2 times of the resonant frequency of each elastic wave resonator. Thus, when the second band elimination filter uses Love waves on LiNbO$_3$ as elastic waves and the first band elimination filter does not use Love waves on LiNbO$_3$ as elastic waves, the reflection coefficient of the first band elimination filter in the second frequency band is effectively increased.

Thus, when the series connection circuit defined by the first band elimination filter and the second band elimination filter is a lower frequency filter and the first filter and the second filter are higher frequency filters, the binding loss of the second filter is reduced.

In ascending order of frequency, the first frequency band, the third frequency band, and the second frequency band may be allocated. Each of the first band elimination filter and the second band elimination filter may have a frequency band, including the third frequency band, as a pass band.

Thus, filters that pass the third frequency band of which the frequencies lie between the first frequency band and the second frequency band is defined by the first band elimination filter and the second band elimination filter.

The first frequency band may be a middle band (MB: about 2110 MHz-about 2200 MHz). The third frequency band may be a middle high band (MHB: about 2300 MHz-about 2400 MHz). The second frequency band may be a high band (HB: about 2496 MHz-about 2690 MHz). The first filter may be a band pass filter having Band66 (reception band: about 2110 MHz-about 2200 MHz) of LTE as a pass band. The second filter may be a band pass filter having Band41 (reception band: about 2496 MHz-about 2690 MHz) of LTE as a pass band. Each of the first band elimination filter and the second band elimination filter may be a band pass filter having Band40 (reception band: about 2300 MHz-about 2400 MHz) as a pass band.

Thus, the radio-frequency front-end circuit may be applied to, for example, a three-way demultiplexer circuit that supports a middle band, a middle high band, and a high band. Thus, in the configuration including a three-way demultiplexer circuit that supports a middle band, a middle high band, and a high band, a small radio-frequency front-end circuit that is able to maintain low-loss signal propagation characteristics is achieved.

In ascending order of frequency, the first frequency band, the second frequency band, and the third frequency band may be allocated. The first band elimination filter and the second band elimination filter may define a high pass filter having a frequency band, including the third frequency band, as a pass band.

Thus, filters that pass the third frequency band having the highest frequencies is defined by the first band elimination filter and the second band elimination filter. Furthermore, since the third frequency band is provided by the high pass filter, the third frequency band is widened.

The third frequency band may be an ultra high band (UHB: about 3400 MHz-about 3800 MHz). The first frequency band may be a middle band (MB: about 2110 MHz-about 2200 MHz). The second frequency band may be a high band (HB: about 2496 MHz-about 2690 MHz). The first filter may be a band pass filter having Band66 (reception band: about 2110 MHz-about 2200 MHz) of LTE as a pass band. The second filter may be a band pass filter having Band41 (reception band: about 2496 MHz-about 2690 MHz) of LTE as a pass band. Each of the first band elimination filter and the second band elimination filter may be a high pass filter having Band42 (reception band: about 3400 MHz-about 3600 MHz) or Band43 (reception band: about 3600 MHz-about 3800 MHz) or both as a pass band.

Thus, the radio-frequency front-end circuit may be applied to, for example, a three-way demultiplexer circuit that supports a middle band, a high band, and an ultra high band. Thus, in the configuration including a three-way demultiplexer circuit that supports a middle band, a high band, and an ultra high band, a small radio-frequency front-end circuit that is able to maintain low-loss signal propagation characteristics is achieved.

The third frequency band may lie at higher frequencies than the first frequency band and the second frequency band. Each of the first band elimination filter and the second band elimination filter may include one or more elastic wave resonators. Each of the one or more elastic wave resonators that define the first band elimination filter may be a surface acoustic wave resonator, the surface acoustic wave resonator may be defined by a substrate including a piezoelectric layer, and an IDT electrode provided on the substrate. The first band elimination filter may be structured to use any one of (1) Rayleigh waves that propagate through the piezoelectric layer made of $LiNbO_3$, (2) leaky waves that propagate through the piezoelectric layer made of $LiTaO_3$, and (3) Love waves that propagate through the piezoelectric layer made of $LiNbO_3$, as surface acoustic waves.

The reflection coefficient of each elastic wave resonator in a lower frequency range than the resonance point and antiresonance point of each elastic wave resonator in the case where any one of Rayleigh waves that propagate through the piezoelectric layer made of $LiNbO_3$, leaky waves that propagate through the piezoelectric layer made of $LiTaO_3$, and Love waves that propagate through the piezoelectric layer made of $LiNbO_3$ are used as surface acoustic waves is larger than the reflection coefficient in the case where other elastic waves are used.

Thus, when the series connection circuit defined by the first band elimination filter and the second band elimination filter is a higher frequency filter and the first filter and the second filter are lower frequency filters, the reflection coefficient of the first band elimination filter in the second frequency band in the case where the first band elimination filter uses elastic waves of any one of the above-described (1), (2), and (3) is larger than the reflection coefficient in the case where the first band elimination filter uses other elastic waves. Thus, the binding loss of the second filter is reduced.

Each elastic wave resonator of the second band elimination filter may be an SMR or an FBAR.

With this configuration, while the reflection coefficient of the first band elimination filter is increased, steepness of the stop band of the second band elimination filter is ensured.

The third frequency band may lie at higher frequencies than the first frequency band and the second frequency band. Each of the first band elimination filter and the second band elimination filter may include one or more elastic wave resonators. Each of the one or more elastic wave resonators that define the first band elimination filter may be a surface acoustic wave resonator, the surface acoustic wave resonator may be defined by a substrate including a piezoelectric layer, and an IDT electrode provided on the substrate. Each elastic wave resonator of the first band elimination filter may have an acoustic velocity film multilayer structure defined by the piezoelectric layer on one of principal surfaces of which the IDT electrode is formed, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer. Each elastic wave resonator of the second band elimination filter may be an SMR or an FBAR.

The reflection coefficient of each elastic wave resonator in a lower frequency range than the resonance point and antiresonance point of the elastic wave resonator in the case where each elastic wave resonator has the acoustic velocity film multilayer structure is larger than the reflection coefficient in the case where each elastic wave resonator is an SMR or an FBAR.

Thus, when the series connection circuit defined by the first band elimination filter and the second band elimination filter is a higher frequency filter and the first filter and the second filter are lower frequency filters, the reflection coefficient of the first band elimination filter in the second frequency band in the case where the first band elimination filter has the acoustic velocity film multilayer structure is larger than the reflection coefficient in the case where the first band elimination filter is an SMR or an FBAR. Thus, the binding loss of the second filter is reduced. In addition, while the reflection coefficient of the first band elimination filter is increased, steepness of the stop band of the second band elimination filter is ensured.

The third frequency band may lie at higher frequencies than the first frequency band and the second frequency band. Each of the first band elimination filter and the second band elimination filter may include one or more elastic wave resonators. The first band elimination filter may be structured to include any one of (1) Rayleigh waves that propagate through a piezoelectric layer made of $LiNbO_3$ are used as surface acoustic waves, (2) leaky waves that propagate through a piezoelectric layer made of $LiTaO_3$ are used as surface acoustic waves, (3) Love waves that propagate through a piezoelectric layer made of $LiNbO_3$ are used as surface acoustic waves, (4) each elastic wave resonator is an SMR, and (5) each elastic wave resonator is an FBAR. Each elastic wave resonator of the second band elimination filter may have an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer.

When each elastic wave resonator has the acoustic velocity film multilayer structure, spurious waves of Rayleigh waves appears around 0.76 times of the resonant frequency of each elastic wave resonator. Thus, when the second band elimination filter has the acoustic velocity film multilayer structure and the first band elimination filter does not have the acoustic velocity film multilayer structure, the reflection coefficient of the first band elimination filter in the second frequency band is increased while good temperature characteristics of the second band elimination filter are ensured.

Thus, when the series connection circuit defined by the first band elimination filter and the second band elimination filter is a higher frequency filter and the first filter and the second filter are lower frequency filters, the binding loss of the second filter is reduced.

The third frequency band may lie at higher frequencies than the first frequency band and the second frequency band. Each of the first band elimination filter and the second band elimination filter may include one or more elastic wave resonators. The first band elimination filter may be structured to include any one of (1) Rayleigh waves that propagate through a piezoelectric layer made of $LiNbO_3$ are used as surface acoustic waves, (2) Love waves that propagate through a piezoelectric layer made of $LiNbO_3$ are used as surface acoustic waves, (3) each elastic wave resonator has an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (4) each elastic wave resonator is an SMR, and (5) each elastic wave resonator is an FBAR. The second band elimination filter may be configured to use leaky waves that propagate through a piezoelectric layer made of $LiTaO_3$ as surface acoustic waves.

When leaky waves on $LiTaO_3$ are used as elastic waves, spurious waves of Rayleigh waves appear around 0.76 times of the resonant frequency of each elastic wave resonator. Thus, when the second band elimination filter uses leaky waves on $LiTaO_3$ as elastic waves and the first band elimination filter does not use leaky waves on $LiTaO_3$ as elastic waves, the reflection coefficient of the first band elimination filter in the second frequency band is effectively increased.

Thus, when the series connection circuit defined by the first band elimination filter and the second band elimination filter is a higher frequency filter and the first filter and the second filter are lower frequency filters, the binding loss of the second filter is reduced.

The radio-frequency front-end circuit may further include a first amplifier circuit connected to the first input-output terminal, a second amplifier circuit connected to the second input-output terminal, and a third amplifier circuit connected to the third input-output terminal.

Thus, a radio-frequency front-end circuit that is able to propagate radio-frequency signals of frequency bands at low loss and that achieves simplification of manufacturing process and miniaturization is provided.

A communication device according to a preferred embodiment of the present invention includes an RF signal processing circuit and a radio-frequency front-end circuit according to one of the preferred embodiments described above. The RF signal processing circuit processes a radio-frequency signal that is transmitted or received by the antenna element. The radio-frequency front-end circuit transmits the radio-frequency signal between the antenna element and the RF signal processing circuit.

With this configuration, a communication device that is able to propagate radio-frequency signals of frequency bands at low loss and that achieves simplification of manufacturing process and miniaturization is provided.

According to preferred embodiments of the present invention, radio-frequency front-end circuits and communication devices that are each able to propagate radio-frequency signals of frequency bands at low loss and that achieve simplification of manufacturing process and miniaturization are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 13A is a view illustrating bulk wave leakage at high frequencies 1 of each band elimination filter according to a first alternative preferred embodiment to the fourth preferred embodiment of the present invention.

FIG. 13B is a table showing combinations of configurations of the band elimination filters according to the first alternative preferred embodiment to the fourth preferred embodiment of the present invention.

FIG. 18A is a view illustrating reflection characteristics at low frequencies 5 and a higher mode that appears at high frequencies 5 of each band elimination filter according to a sixth alternative preferred embodiment to the fourth preferred embodiment of the present invention.

FIG. 18B is a table showing combinations of configurations of the band elimination filters according to the sixth alternative preferred embodiment to the fourth preferred embodiment of the present invention.

FIG. 19A is a graph showing deterioration of return loss due to a higher mode of each band elimination filter according to the fourth preferred embodiment of the present invention.

FIG. 19B is a table showing parameters that vary the structure of each band elimination filter according to a seventh alternative preferred embodiment to the fourth preferred embodiment of the present invention.

FIG. 19C is a table showing parameters that vary the structure of each band elimination filter according to an eighth alternative preferred embodiment to the fourth preferred embodiment of the present invention.

FIG. 20 is a table showing parameters that vary the structure of each band elimination filter according to a ninth alternative preferred embodiment to the fourth preferred embodiment of the present invention.

DETAILED DESCRIPTION OF THE PREFERRED EMBODIMENTS

Figure 1:
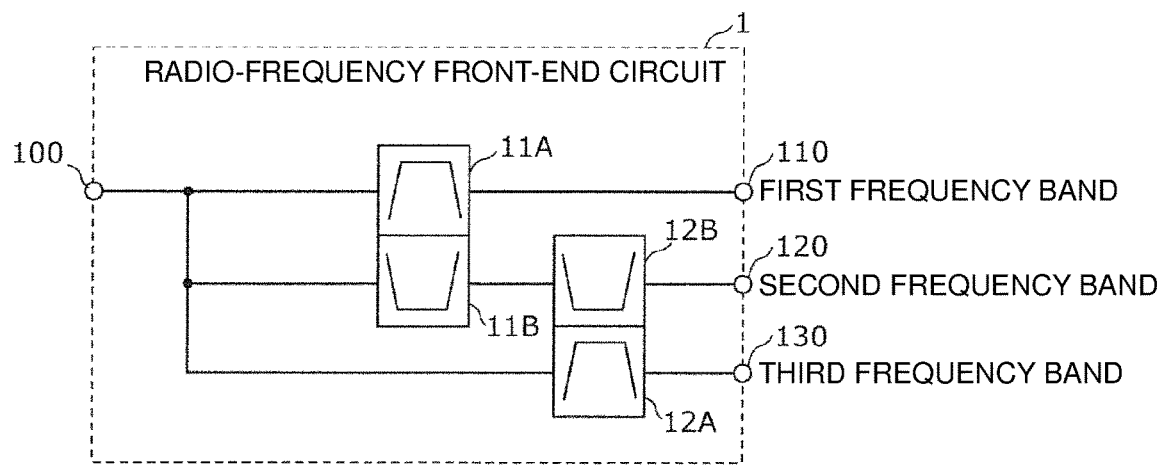
FIG. 1 is a circuit configuration diagram of a radio-frequency front-end circuit according to a first preferred embodiment of the present invention.

Hereinafter, preferred embodiments of the present invention will be described in detail with reference to the drawings. Any of the preferred embodiments that will be described below describes a comprehensive or specific example. Numeric values, shapes, materials, elements, disposition and connection modes of the elements, and the like, that will be described below are for illustrative purposes only, and are not intended to limit the present invention. Of the elements in the following preferred embodiments, the elements not included in the independent claims will be described as optional elements. In addition, the size or size ratio of elements shown in the drawings is not necessarily strict.

First Preferred Embodiment

FIG. 1 is a circuit configuration diagram of a radio-frequency front-end circuit 1 according to a first preferred embodiment of the present invention. As shown in FIG. 1, the radio-frequency front-end circuit 1 preferably includes a first filter 11A, a first band elimination filter 11B, a second filter 12A, a second band elimination filter 12B, an antenna common terminal 100, and input-output terminals 110, 120, 130. The radio-frequency front-end circuit 1 is a multiplexer-demultiplexer circuit including the first filter 11A, the second filter 12A, and the pair of first band elimination filter 11B and second band elimination filter 12B. The first filter 11A, the second filter 12A, and the pair of first band elimination filter 11B and second band elimination filter 12B are bound by the antenna common terminal 100.

The antenna common terminal 100 is preferably connectable to, for example, an antenna element. Each of the input-output terminals 110, 120, 130 is connectable to a radio-frequency signal processing circuit via an amplifier circuit.

The first filter 11A is connected between the antenna common terminal 100 and the input-output terminal 110. The first filter 11A is a band pass filter having a frequency band, including a first frequency band, as a pass band.

The second filter 12A is connected between the antenna common terminal 100 and the input-output terminal 130. The second filter 12A is a band pass filter having a frequency band, including a second frequency band different from the first frequency band, as a pass band.

The first band elimination filter 11B is connected between the antenna common terminal 100 and the input-output terminal 120. The first band elimination filter 11B is a band elimination filter having a frequency band, including the first frequency band and not including a third frequency band different from the first frequency band or the second frequency band, as a stop band.

The second band elimination filter 12B is connected in series with the first band elimination filter 11B between the antenna common terminal 100 and the input-output terminal 120. The second band elimination filter 12B is a band elimination filter having a frequency band, including the second frequency band and not including the third frequency band, as a stop band.

A series connection circuit defined by the first band elimination filter 11B and the second band elimination filter 12B is a filter circuit having a frequency band, including the third frequency band, as a pass band and having the first frequency band and the second frequency band as a stop band.

The first filter 11A is connected to the antenna common terminal 100, but not connected to the antenna common terminal 100 by the first band elimination filter 11B or the second band elimination filter 12B. The second filter 12A is connected to the antenna common terminal 100, but not connected to the antenna common terminal 100 by the first band elimination filter 11B or the second band elimination filter 12B.

In an existing art, when a multiplexer circuit that supports three different frequency bands is made, a band pass filter is disposed in each signal path that passes a radio-frequency signal of a corresponding one of the frequency bands, and each band pass filter has the corresponding one of the frequency bands as a pass band. That is, three band pass filters are required for three frequency bands.

In contrast to this, with the radio-frequency front-end circuit 1 according to the present preferred embodiment, a filter having the third frequency band as a pass band is the series connection circuit defined by the first band elimination filter 11B and the second band elimination filter 12B. The first band elimination filter 11B is a filter having the first frequency band that is the pass band of the first filter 11A as a stop band. Therefore, for example, in designing and manufacturing the first band elimination filter 11B defined by an elastic wave resonator, desired parameters of each elastic wave resonator of the first filter 11A are applicable, and a similar manufacturing process to that of the first filter 11A is applicable. Furthermore, each elastic wave resonator of the first filter 11A may also be used as the elastic wave resonator of the first band elimination filter 11B.

The second band elimination filter 12B is a filter having the second frequency band that is the pass band of the second filter 12A as a stop band. Therefore, for example, in manufacturing the second band elimination filter 12B defined by an elastic wave resonator, desired parameters of each elastic wave resonator of the second filter 12A are applicable, and a similar manufacturing process to that of the second filter 12A is applicable. Furthermore, each elastic wave resonator of the second filter 12A may also be used as the elastic wave resonator of the second band elimination filter 12B.

That is, in the present preferred embodiment, in manufacturing a multiplexer-demultiplexer circuit that supports three frequency bands, a filter circuit having the first frequency band as a pass band or a stop band and a filter circuit having the second frequency band as a pass band or a stop band just need to be designed and manufactured. Thus, in making up a multiplexer-demultiplexer circuit, band pass filters do not need to be provided in a number equivalent to the number of frequency bands, so a reduction in design man-hour, simplification of manufacturing process, and miniaturization are achieved.

In addition, with the above configuration, a filter having the third frequency band as a pass band is defined by the two serially connected first band elimination filter 11B and second band elimination filter 12B. Since the second filter 12A and the second band elimination filter 12B are not connected in common to the antenna terminal and are electrically independent of each other, the second band elimination filter 12B is not affected by the second filter 12A. Thus, in the signal path that propagates the radio-frequency signal of the third frequency band, the insertion loss in the pass band is reduced as compared to when the second filter 12A and the second band elimination filter 12B are not electrically independent of each other (that is, when the second filter 12A and the second band elimination filter 12B are connected in common).

In the signal path that propagates the radio-frequency signal of the first frequency band, a signal does not pass through any band elimination filter and passes through only the first filter. In the signal path that propagates the radio-frequency signal of the second frequency band, a signal does not pass through any band elimination filter and passes through only the second filter. That is, since a signal that passes through the second input-output terminal passes through only the second filter that is electrically independent of the second band elimination filter, the insertion loss is reduced.

In the signal path that propagates the radio-frequency signal of the first frequency band, a signal does not pass through the band elimination filters 11B, 12B and passes through only the first filter 11A. In the signal path that propagates the radio-frequency signal of the second frequency band, a signal does not pass through the band elimination filters 11B, 12B and passes through only the second filter 12A. That is, since a signal that passes through the input-output terminal 130 passes through only the second filter 12A that is electrically independent of the second band elimination filter 12B, the insertion loss is reduced. In the signal path that propagates the radio-frequency signal of the third frequency band, a signal does not pass through any band pass filter and passes through only the two band elimination filters 11B, 12B. That is, even when only the two band elimination filters 11B, 12B are disposed in the signal path that propagates the radio-frequency signal of the third frequency band, the signal paths that propagate the radio-frequency signals of the first and second frequency bands do not need to propagate a signal by any one of the two band elimination filters 11B, 12B. In other words, since each of the signal paths that support the corresponding frequency bands propagates a signal by only one of the band pass filter and the band elimination filters, the radio-frequency signal of each frequency band is propagated with low loss.

An example in which the radio-frequency front-end circuit 1 according to the present preferred embodiment is applied to a long term evolution (LTE) multiband system will now be described.

Figure 2:
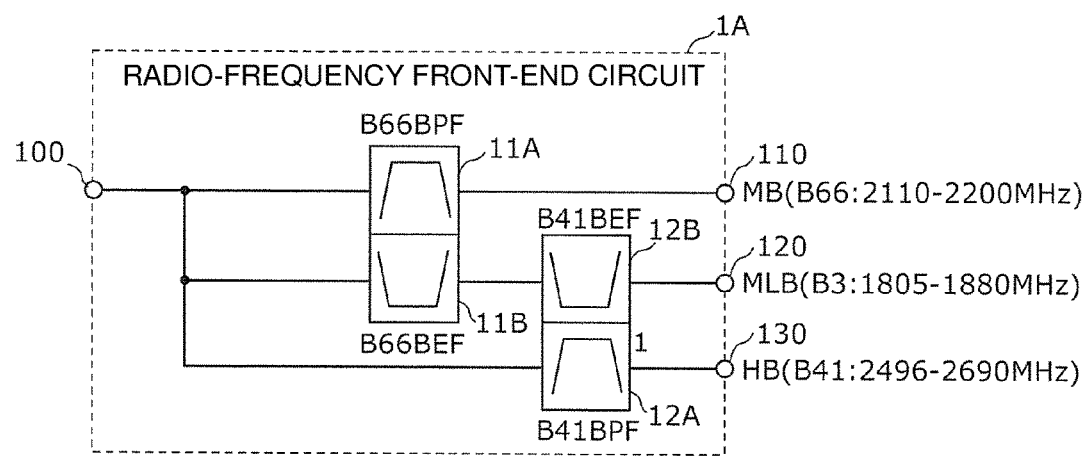
FIG. 2 is a specific circuit configuration diagram of the radio-frequency front-end circuit according to the first preferred embodiment of the present invention.

FIG. 2 is a specific circuit configuration diagram of a radio-frequency front-end circuit 1A according to the first preferred embodiment. The radio-frequency front-end circuit 1A shown in the diagram is an example in which the radio-frequency front-end circuit 1 is preferably applied to an LTE receiver demultiplexer circuit. In the radio-frequency front-end circuit 1A, a middle low band (MLB: about 1475.9 MHz-about 2025 MHz) is allocated as the third frequency band, a middle band (MB: about 2110 MHz-about 2200 MHz) is allocated as the first frequency band, and a high band (HB: about 2496 MHz-about 2690 MHz) is allocated as the second frequency band. That is, in ascending order of frequency, the third frequency band, the first frequency band, and the second frequency band are allocated.

Figure 3:
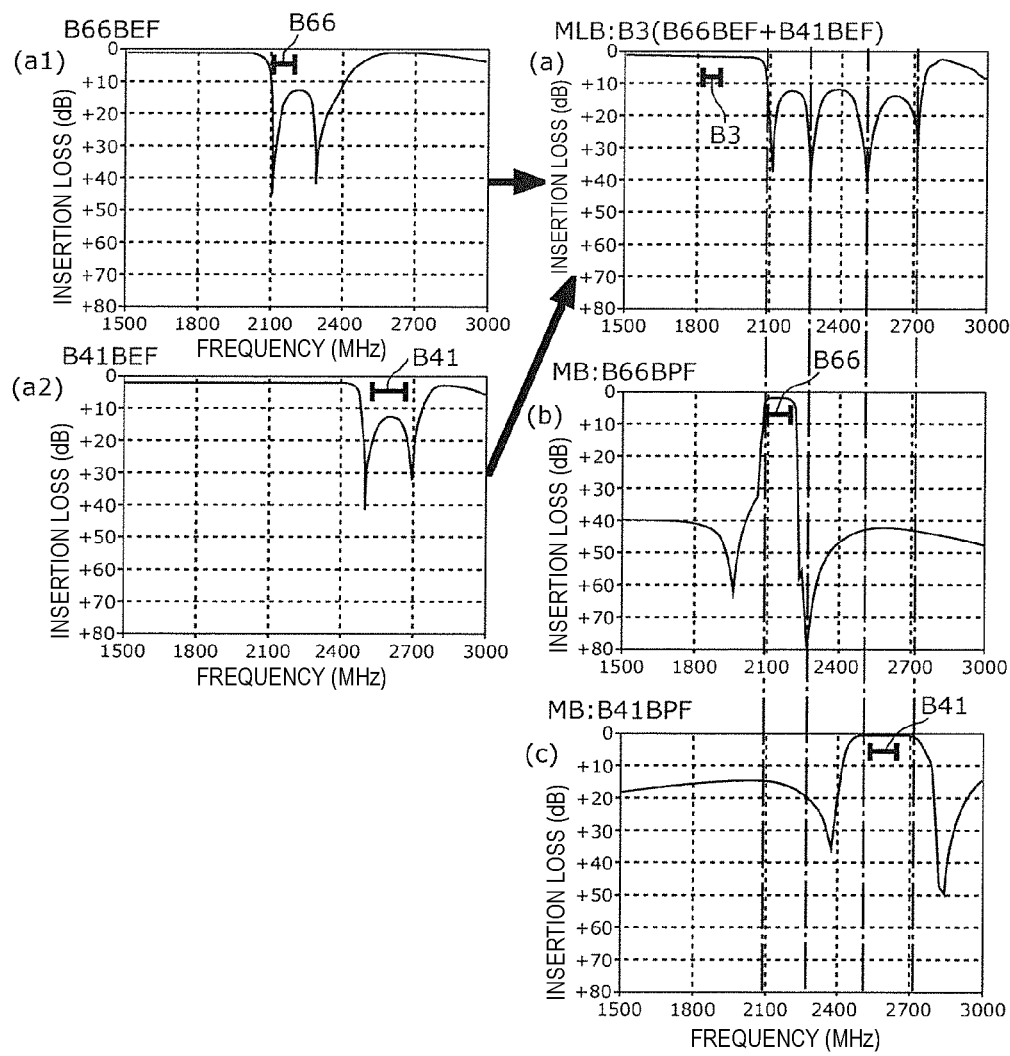
FIG. 3 shows graphs showing bandpass characteristics of filters of the radio-frequency front-end circuit according to the first preferred embodiment of the present invention.

FIG. 3 shows graphs showing the bandpass characteristics of the first filter 11A, first band elimination filter 11B, second filter 12A, and second band elimination filter 12B of the radio-frequency front-end circuit 1A according to the first preferred embodiment.

As shown in (b) of FIG. 3, the first filter 11A is a band pass filter that has filter bandpass characteristics that Band66 (about 2110 MHz-about 2200 MHz) is a pass band.

As shown in (c) of FIG. 3, the second filter 12A is a band pass filter that has filter bandpass characteristics that Band41 (about 2496 MHz-about 2690 MHz) is a pass band.

As shown in (a1) of FIG. 3, the first band elimination filter 11B is a band elimination filter that has filter bandpass characteristics that Band66 (about 2110 MHz-about 2200 MHz) is a stop band.

As shown in (a2) of FIG. 3, the second band elimination filter 12B is a band elimination filter that has filter bandpass characteristics that Band41 ((about 2496 MHz-about 2690 MHz) is a stop band.

As shown in (a) of FIG. 3, the series connection circuit defined by the first band elimination filter 11B and the second band elimination filter 12B defines a low pass filter that has filter bandpass characteristics that the middle low band (MLB: about 1475.9 MHz-about 2025 MHz), including the reception band (about 1805 MHz-about 1880 MHz) of Band3, is a pass band and Band66 (about 2110 MHz-about 2200 MHz) and Band41 (about 2496 MHz-about 2690 MHz) are stop bands.

With the present example of a preferred embodiment of the present invention, the third frequency band having the lowest frequencies is preferably defined by the first band elimination filter 11B and the second band elimination filter 12B.

In the present example of a preferred embodiment of the present invention, the first band elimination filter 11B is a band elimination filter having Band41 (about 2496 MHz-about 2690 MHz) as a stop band, and the second band elimination filter 12B is a band elimination filter having Band66 (about 2110 MHz-about 2200 MHz) as a stop band. That is, the band elimination filter having Band41 as a stop band may be connected in a preceding stage (on the antenna common terminal 100 side), and the band elimination filter having Band66 as a stop band may be connected in a subsequent stage (on the input-output terminal 120 side).

Figure 4:
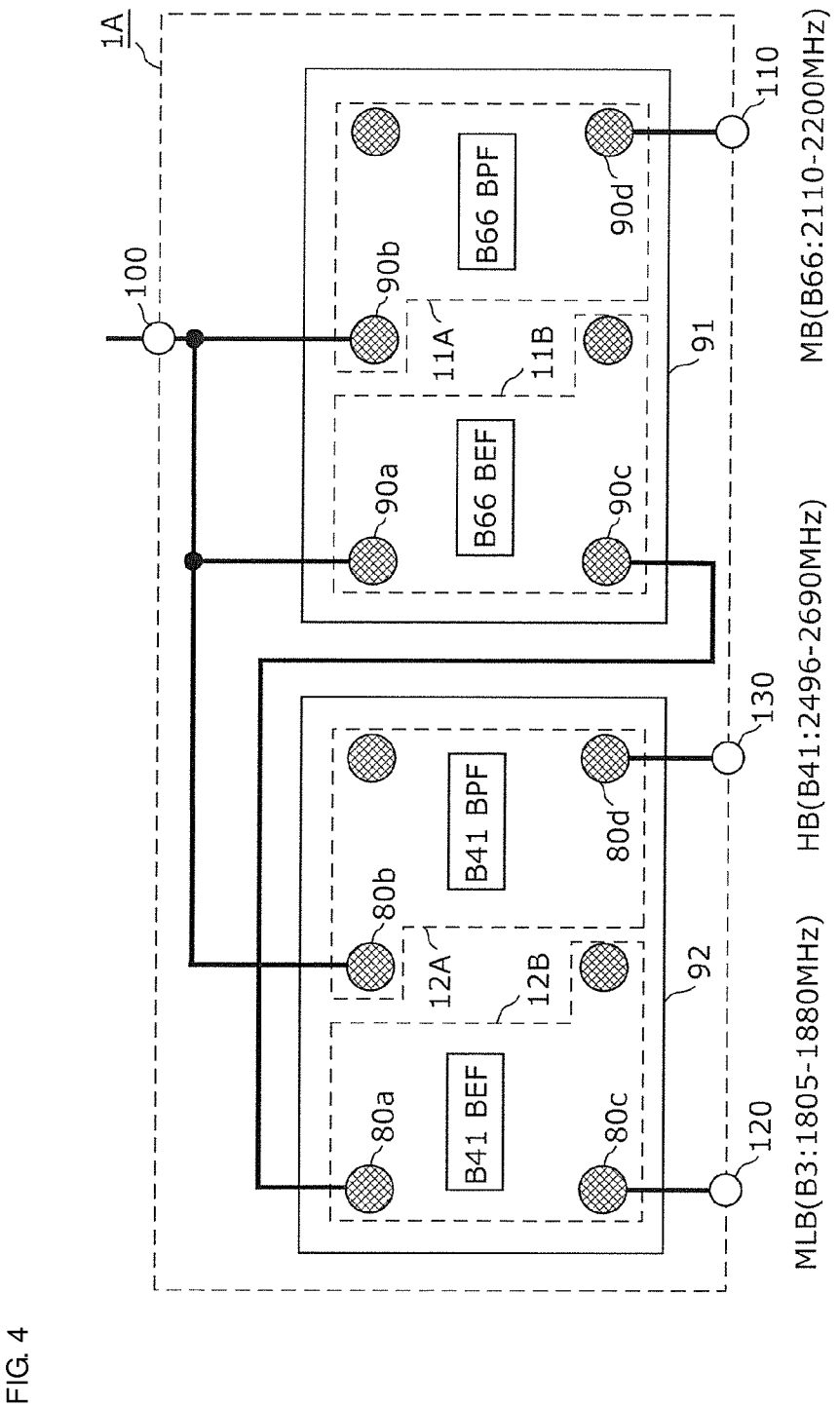
FIG. 4 is a diagram showing a chip layout of the radio-frequency front-end circuit according to the first preferred embodiment of the present invention.

FIG. 4 is a diagram showing a chip layout of the radio-frequency front-end circuit 1A according to the first preferred embodiment.

FIG. 4 shows a preferred chip layout (mounting configuration) of the first filter 11A, second filter 12A, first band elimination filter 11B, and second band elimination filter 12B that are the elements of the radio-frequency front-end circuit 1A. As shown in the diagram, the radio-frequency front-end circuit 1A is preferably defined by a first chip 91 and a second chip 92.

The first filter 11A and the first band elimination filter 11B are provided in the first chip 91. The second filter 12A and the second band elimination filter 12B are provided in the second chip 92.

The first filter 11A is connected to the antenna common terminal 100 via a connection electrode 90b on the first chip 91. The first filter 11A is connected to the input-output terminal 110 via a connection electrode 90d on the first chip 91. The first band elimination filter 11B is connected to the antenna common terminal 100 via a connection electrode 90a on the first chip 91. The first band elimination filter 11B is connected to the second band elimination filter 12B via a connection electrode 90c on the first chip 91 and a connection electrode 80a on the second chip 92.

The second filter 12A is connected to the antenna common terminal 100 via a connection electrode 80b on the second chip 92. The second filter 12A is connected to the input-output terminal 130 via a connection electrode 80d on the second chip 92. The second band elimination filter 12B is connected to the input-output terminal 120 via a connection electrode 80c on the second chip 92.

The first chip 91 and the second chip 92 may be electrically connected to each other by wires provided on or in an implementation board on or in which the first chip 91 and the second chip 92 are implemented. Alternatively, the first chip 91 and the second chip 92 may be directly electrically connected to each other by bonding wires.

Each of the filters of the radio-frequency front-end circuit 1A is preferably defined by, for example, a surface acoustic wave resonator. In this case, each filter takes, for example, a ladder filter configuration including a series arm resonator and a parallel arm resonator, and each of the series arm resonator and the parallel arm resonator is preferably defined by an interdigital transducer (IDT) electrode provided on a piezoelectric substrate.

The first filter 11A preferably has filter bandpass characteristics in which Band66 (about 2110 MHz-about 2200 MHz) is a pass band. The first band elimination filter 11B preferably has filter bandpass characteristics in which the same Band66 is a stop band. In the case of the ladder filter configuration, the pass band and the stop band are regulated by the resonance point and antiresonance point of each of the series arm resonator and the parallel arm resonator. Therefore, each resonator of the first filter 11A and each resonator of the first band elimination filter 11B are allowed to be defined by IDT electrodes having approximately the same electrode finger pitch. Thus, the first filter 11A and the first band elimination filter 11B are easily provided on a single piezoelectric substrate using the same manufacturing process.

The second filter 12A preferably has filter bandpass characteristics in which Band41 (about 2496 MHz-about 2690 MHz) is a pass band. The second band elimination filter 12B preferably has filter bandpass characteristics in which the same Band41 is a stop band. In the case of the ladder filter configuration, the pass band and the stop band are regulated by the resonance point and antiresonance point of each of the series arm resonator and the parallel arm resonator. Therefore, each resonator of the second filter 12A and each resonator of the second band elimination filter 12B are allowed to be defined by IDT electrodes having approximately the same electrode finger pitch. Thus, the second filter 12A and the second band elimination filter 12B are easily provided on a single piezoelectric substrate using the same manufacturing process.

From the above viewpoint, the first filter 11A and the first band elimination filter 11B are provided in the single first chip 91, and the second filter 12A and the second band elimination filter 12B are provided in the single second chip 92.

With the above configuration, in manufacturing the first band elimination filter 11B, desired parameters of each elastic wave resonator of the first filter 11A having the first frequency band (Band66) as a pass band are applicable, and a similar manufacturing process to that of the first filter 11A is applicable. Furthermore, each elastic wave resonator of the first filter 11A may also be used. In manufacturing the second band elimination filter 12B, desired parameters of each elastic wave resonator of the second filter 12A having the second frequency band (Band41) as a pass band are applicable, and a similar manufacturing process to that of the second filter 12A is applicable. Furthermore, each elastic wave resonator of the second filter 12A may also be used. Thus, the first filter 11A and the first band elimination filter 11B are easily provided in the same first chip 91, and the second filter 12A and the second band elimination filter 12B are easily provided in the same second chip 92. As a result, further simplification of manufacturing process and miniaturization are possible.

In the above-described chip layout of the radio-frequency front-end circuit 1A, a ladder SAW filter is preferably used as each filter; however, each filter is not limited thereto. Each filter may include a longitudinally-coupled filter circuit. In this case as well, the first filter 11A and the first band elimination filter 11B may have the same electrode finger pitch of each IDT electrode of the longitudinally-coupled filter circuit, and the second filter 12A and the second band elimination filter 12B may have the same electrode finger pitch. Alternatively, each filter may be not a SAW filter, but may instead be a bulk acoustic wave (BAW) filter. In this case as well, the first filter 11A and the first band elimination filter 11B may have the same structure parameters of each resonator of the BAW filter, and the second filter 12A and the second band elimination filter 12B may have the same structure parameters. Thus, the first filter 11A and the first band elimination filter 11B may be provided in the single first chip 91, and the second filter 12A and the second band elimination filter 12B may be provided in the single second chip 92.

Alternatively, the first filter 11A and the first band elimination filter 11B that are provided in the first chip 91 each may be defined by elastic wave resonators that use SAW, and the second filter 12A and the second band elimination filter 12B that are provided in the second chip 92 may be defined by elastic wave resonators that use BAW. Thus, the second filter 12A and the second band elimination filter 12B each are able to ensure a large reflection coefficient, and the first filter 11A and the first band elimination filter 11B each have high band width flexibility.

Alternatively, the first filter 11A and the first band elimination filter 11B each may be defined by elastic wave resonators that use BAW, and the second filter 12A and the second band elimination filter 12B each may be defined by elastic wave resonators that use SAW.

In this case, the first filter 11A and the first band elimination filter 11B each are able to ensure a large reflection coefficient, and the second filter 12A and the second band elimination filter 12B each have high band width flexibility.

Alternatively, each of the first filter 11A, the first band elimination filter 11B, the second filter 12A, and the second band elimination filter 12B may be defined by elastic wave resonators that use BAW, or may be defined by elastic wave resonators that use SAW. That is, the first filter 11A and the second filter 12A are allowed to be prepared for SAW or BAW in conformity with requirement specifications of radio-frequency signals that pass through the first frequency band and the second frequency band, so the flexibility of design improves.

Figure 5:
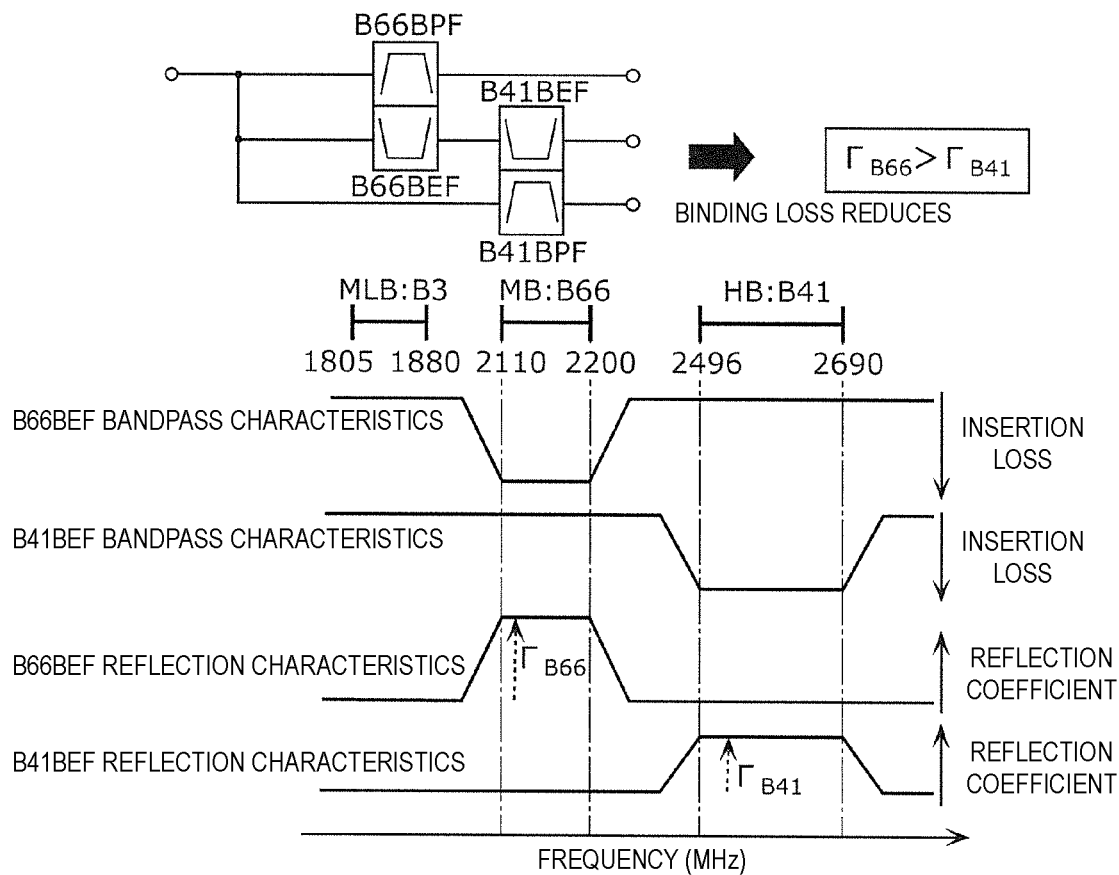
FIG. 5 is a chart showing the relationship among reflection coefficients at which a binding loss of the radio-frequency front-end circuit according to the first preferred embodiment of the present invention is reduced.

FIG. 5 is a chart showing the relationship among reflection coefficients at which the binding loss of the radio-frequency front-end circuit 1A according to the first preferred embodiment is reduced. At the bottom of the chart, the bandpass characteristics of each of the first band elimination filter 11B (B66BEF) and second band elimination filter 12B (B41BEF) bound by the antenna common terminal 100 and the reflection characteristics of each of the first band elimination filter 11B (B66BEF) and second band elimination filter 12B (B41BEF) are shown. As shown at the top of the chart, the first band elimination filter 11B is connected on the antenna common terminal 100 side, and the second band elimination filter 12B is connected on the input-output terminal 120 side. In the radio-frequency front-end circuit 1A according to the present preferred embodiment, it is desirable that the reflection coefficient $\Gamma_{B66}$ of the first band elimination filter 11B in the first frequency band (Band66 pass band) when the first band elimination filter 11B is viewed from the antenna common terminal 100 side alone be larger than the reflection coefficient $\Gamma_{B41}$ of the second band elimination filter 12B in the second frequency band (Band41 pass band) when the second band elimination filter 12B is viewed from the antenna common terminal 100 side alone.

As in the case of the radio-frequency front-end circuit 1A according to the present preferred embodiment, in the case of the configuration that the first filter 11A, the second filter 12A, and the pair of first band elimination filter 11B and second band elimination filter 12B that define the receiver demultiplexer circuit are bound by the antenna common terminal 100, the insertion loss of the first filter 11A in the pass band (Band66) is affected by the reflection characteristics of another filter when viewed from the antenna common terminal 100 side in addition to the insertion loss of the first filter 11A only. The insertion loss of the second filter 12A in the pass band (Band41) is affected by the reflection characteristics of another filter when viewed from the antenna common terminal 100 side in addition to the insertion loss of the second filter 12A only. Among these, the insertion loss of the first filter 11A in the pass band reduces as the reflection coefficient of the first band elimination filter 11B in the first frequency band when viewed from the antenna common terminal 100 side increases. The insertion loss of the second filter 12A in the pass band reduces as the reflection coefficient of the second band elimination filter 12B in the second frequency band when viewed from the antenna common terminal 100 side increases (the insertion loss of the first filter 11A due to the reflection coefficient of the first band elimination filter 11B and the insertion loss of the second filter 12A due to the reflection coefficient of the second band elimination filter 12B are referred to as binding losses).

Since the first band elimination filter 11B is connected closer to the antenna common terminal 100 than the second band elimination filter 12B, the binding loss of the first filter 11A due to the first band elimination filter 11B is larger than the binding loss of the second filter 12A due to the second band elimination filter 12B. Therefore, when the reflection coefficient $\Gamma_{B66}$ of the first band elimination filter 11B in the first frequency band is made larger than the reflection coefficient $\Gamma_{B41}$ of the second band elimination filter in the second frequency band, the binding loss of the radio-frequency front-end circuit 1A is effectively reduced.

Thus, since the binding losses of the first filter 11A and second filter 12A are effectively reduced without disposing a switch between the antenna element and each of the first filter 11A and the second filter 12A, a small radio-frequency front-end circuit that is able to maintain low-loss signal propagation characteristics even during, for example, carrier aggregation (CA) operation is provided.

When the second band elimination filter 12B (the band elimination filter preferably having Band41 as a stop band) is connected in a preceding stage (on the antenna common terminal 100 side) and the first band elimination filter 11B (the band elimination filter preferably having Band66 as a stop band) is connected in a subsequent stage (on the input-output terminal 120 side), it is desirable that the reflection coefficient $\Gamma_{B41}$ of the second band elimination filter 12B in the second frequency band (Band41 pass band) when the second band elimination filter 12B is viewed from the antenna common terminal 100 side alone be larger than the reflection coefficient $\Gamma_{B66}$ of the first band elimination filter 11B in the first frequency band (Band66 pass band) when the first band elimination filter 11B is viewed from the antenna common terminal 100 side alone. Thus, the binding loss of the radio-frequency front-end circuit 1A is effectively reduced.

Figure 6:
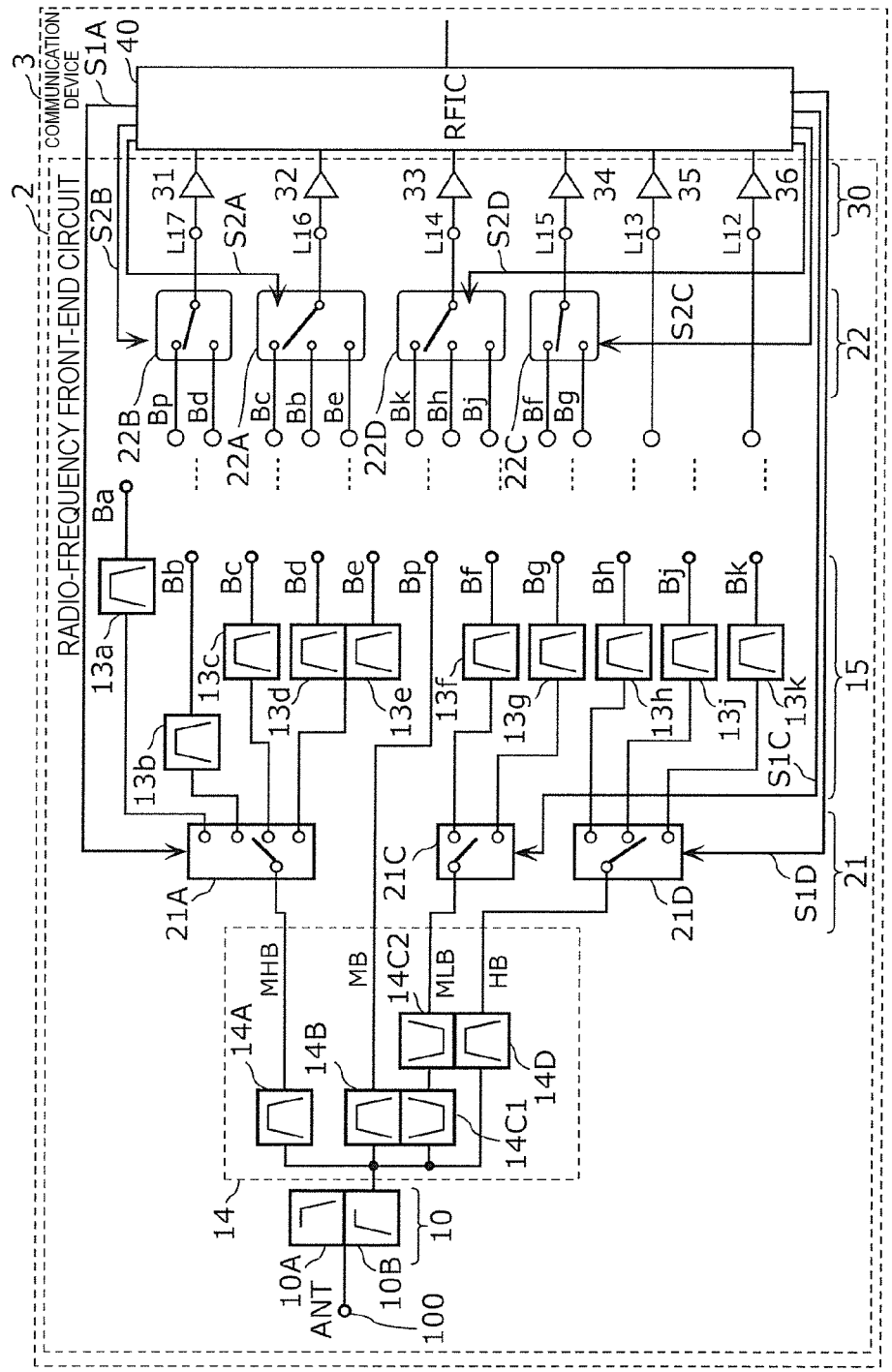
FIG. 6 is a circuit configuration diagram of a communication device according to an alternative embodiment to the first preferred embodiment of the present invention.

FIG. 6 is a circuit configuration diagram of a communication device 3 according to an alternative preferred embodiment to the first preferred embodiment. In FIG. 6, the communication device 3 according to the present preferred embodiment is shown. The communication device 3 is preferably defined by a radio-frequency front-end circuit 2 according to the present alternative preferred embodiment and a radio-frequency signal processing circuit (RFIC) 40.

The radio-frequency front-end circuit 2 preferably includes the antenna common terminal 100, demultiplexer circuits 10, 14, switches 21, 22, a filter circuit 15, and an amplifier circuit 30.

The demultiplexer circuit 10 is connected to the antenna common terminal 100. The demultiplexer circuit 10 is preferably defined by a low pass filter 10A (pass band: about 699 MHz-about 960 MHz) and a high pass filter 10B (pass band: about 1475.9 MHz-about 2690 MHz).

The demultiplexer circuit 14 is the one to which the radio-frequency front-end circuit 1 according to the first preferred embodiment is applied. The demultiplexer circuit 14 preferably includes a band pass filter 14A, a first filter 14B, a first band elimination filter 14C1, a second band elimination filter 14C2, and a second filter 14D.

The band pass filter 14A is connected between an output terminal of the high pass filter 10B and the switch 21A. The band pass filter 14A is a band pass filter having a frequency band, including a middle high band (MHB: about 2300 MHz-about 2400 MHz), as a pass band.

The first filter 14B is connected to the output terminal of the high pass filter 10B. The first filter 14B is a band pass filter having a frequency band, including a middle band (MB: about 2110 MHz-about 2200 MHz) that is the first frequency band, as a pass band. The first filter 14B corresponds to the first filter 11A of the radio-frequency front-end circuit 1 according to the first preferred embodiment.

The second filter 14D is connected between the output terminal of the high pass filter 10B and the switch 21D. The second filter 14D is a band pass filter having a frequency band, including a high band (HB: about 2496 MHz-about 2690 MHz) that is the second frequency band, as a pass band. The second filter 14D corresponds to the second filter 12A of the radio-frequency front-end circuit 1 according to the first preferred embodiment.

The first band elimination filter 14C1 is connected between the output terminal of the high pass filter 10B and the switch 21C. The first band elimination filter 14C1 is a band elimination filter having the middle band (MB: about 2110 MHz-about 2200 MHz) that is the first frequency band as a stop band. The first band elimination filter 14C1 corresponds to the first band elimination filter 11B of the radio-frequency front-end circuit 1 according to the first preferred embodiment.

The second band elimination filter 14C2 is preferably connected in series with the first band elimination filter 14C1 between the output terminal of the high pass filter 10B and the switch 21C. The second band elimination filter 14C2 is a band elimination filter having the high band (HB: about 2496 MHz-about 2690 MHz) that is the second frequency band as a stop band. The second band elimination filter 14C2 corresponds to the second band elimination filter 12B of the radio-frequency front-end circuit 1 according to the first preferred embodiment.

A series connection circuit defined by the first band elimination filter 14C1 and the second band elimination filter 14C2 makes up a filter circuit. The filter circuit has the middle low band (MLB: about 1475.9 MHz-about 2025 MHz) that is the third frequency band as a pass band, and has the middle band (MB: about 2110 MHz-about 2200 MHz) that is the first frequency band and the high band (HB: about 2496 MHz-about 2690 MHz) that is the second frequency band as a stop band.

According to the present example of a preferred embodiment of the present invention, filters that pass the third frequency band of which the frequencies are lower than those of the first frequency band and second frequency band is defined by the first band elimination filter 14C1 and the second band elimination filter 14C2. With this configuration, in manufacturing a multiplexer-demultiplexer circuit that supports four frequency bands, a band pass filter circuit having MHB as a pass band, a filter circuit having the first frequency band (MB) as a pass band or a stop band, and a filter circuit having the second frequency band (HB) as a pass band or a stop band just need to be manufactured. Thus, in making up a multiplexer-demultiplexer circuit, band pass filters do not need to be provided in a number equivalent to the number of frequency bands, so a reduction in design man-hour, simplification of manufacturing process, and miniaturization are achieved.

The switch 21 is preferably defined by switches 21A, 21C, 21D. The switch 22 is defined by switches 22A, 22B, 22C, 22D.

The filter circuit 15 is preferably defined by filters 13a, 13b, 13c, 13d, 13e, 13f, 13g, 13h, 13j, 13k.

The amplifier circuit is preferably defined by LNAs 31, 32, 33, 34, 35, 36.

The demultiplexer circuit 14 divides the frequency band of a radio-frequency signal into four frequency band groups. More specifically, the band pass filter 14A has the middle high band (MHB: about 2300 MHz-about 2400 MHz) as a pass band, and passes signals of Ba (band a), Bb (band b), Bc (band c), Bd (band d), and Be (band e). The first filter 14B has the middle band (MB: about 2110 MHz-about 2200 MHz) as a pass band, and passes a signal of Bp (band p). The filter circuit defined by the series connection circuit between the first band elimination filter 14C1 and the second band elimination filter 14C2 has the middle low band (MLB: about 1475.9 MHz-about 2025 MHz) as a pass band, and passes signals of Bf (band f) and Bg (band g). The second filter 14D has the high band (HB: about 2496 MHz-about 2690 MHz) as a pass band, and passes signals of Bh (band h), Bj (band j), and Bk (band k).

A common terminal of the switch 21A is preferably connected to the band pass filter 14A. Selection terminals of the switch 21A are connected to the filter 13a (Ba), the filter 13b (Bb), the filter 13c (Bc), and the pair of filters 13d, 13e (Bd, Be), respectively.

A common terminal of the switch 21C is preferably connected to the second band elimination filter 14C2. Selection terminals of the switch 21C are connected to the filter 13f (Bf) and the filter 13g (Bg), respectively.

A common terminal of the switch 21D is preferably connected to the second filter 14D. Selection terminals of the switch 21D are connected to the filter 13h (Bh), the filter 13j (Bj), and the filter 13k (Bk), respectively.

A common terminal of the switch 22B is preferably connected to the LNA 31. Selection terminals of the switch 22B are connected to the first filter 14B and the filter 13d, respectively.

A common terminal of the switch 22A is preferably connected to the LNA 32. Selection terminals of the switch 22A are connected to the filters 13c, 13b, 13e, respectively.

A common terminal of the switch 22D is preferably connected to the LNA 33. Selection terminals of the switch 22D are connected to the filters 13k, 13h, 13j, respectively.

A common terminal of the switch 22C is preferably connected to the LNA 34. Selection terminals of the switch 22C are connected to the filters 13f, 13g, respectively.

The pass band (about 2300 MHz-about 2400 MHz) of the band pass filter 14A is wider than the pass bands of the filter 13a (Ba), filter 13b (Bb), filter 13c (Bc), and pair of filters 13d, 13e (Bd, Be), and contains these pass bands. The pass band of the first filter 14B (about 2110 MHz-about 2200 MHz) contains the pass band of Bp. The pass band (about 1475.9 MHz-about 2025 MHz) of the filter circuit defined by the series connection circuit between the first band elimination filter 14C1 and the second band elimination filter 14C2 is wider than the pass bands of the filter 13f (Bf) and filter 13g (Bg), and contains these pass bands. The pass band (about 2496 MHz-about 2690 MHz) of the second filter 14D is wider than the pass bands of the filter 13h (Bh), filter 13j (Bj), and filter 13k (Bk), and contains these pass bands.

The radio-frequency signal processing circuit (RFIC) 40 is connected to output terminals of the LNAs 31 to 36. The radio-frequency signal processing circuit 40 performs signal processing on radio-frequency reception signals, input from the antenna element via reception signal paths of the bands, by down conversion, or the like, and outputs reception signals generated through the signal processing to a subsequent baseband signal processing circuit. The radio-frequency signal processing circuit 40 is, for example, an RFIC. The radio-frequency signal processing circuit (RFIC) 40 outputs control signals S1A, S1C, S1D, S2A, S2B, S2C, S2D respectively to the switches 21A, 21C, 21D, 22A, 22B, 22C, 22D for bands to be used. Thus, each switch switches the connection of a signal path.

In the communication device 3 having the above configuration, for example, one band is selected from each of MLB (about 1475.9 MHz-about 2025 MHz), MB (about 2110 MHz-about 2200 MHz), MHB (about 2300 MHz-about 2400 MHz), and HB (about 2496 MHz-about 2690 MHz) by switching a corresponding one of the switches 21A, 21C, 21D. Thus, the CA operation is possible.

With the above configuration, when the radio-frequency front-end circuit 1 according to the first preferred embodiment is applied as the demultiplexer circuit 14, even when the number of bands for CA operation increases, small radio-frequency front-end circuits and communication devices with manufacturing processes that are simplified are provided while low-loss signal propagation characteristics are maintained. In addition, for example, the radio-frequency front-end circuit and the communication device are allowed to be configured to support all CA combinations defined in 3GPP standards.

In the present alternative preferred embodiment of the present invention, the receiving radio-frequency front-end circuit that receives a radio-frequency signal from the antenna element and that transmits the radio-frequency signal to the radio-frequency signal processing circuit 40 is illustrated. Instead, the radio-frequency front-end circuit may be a transmitting radio-frequency front-end circuit or may be a transmitting and receiving radio-frequency front-end circuit. In the case of the transmitting radio-frequency front-end circuit, the amplifier circuit 30 is defined by power amplifiers. In the case of the transmitting and receiving radio-frequency front-end circuit, the filter circuit 15 is defined by duplexers assigned to the bands.

Second Preferred Embodiment

In the present preferred embodiment, a radio-frequency front-end circuit 1B applied to an LTE multiband system different from the system to which the radio-frequency front-end circuit 1A according to the first preferred embodiment is applied, and a communication device on which the radio-frequency front-end circuit 1B is mounted will be described.

Figure 7:
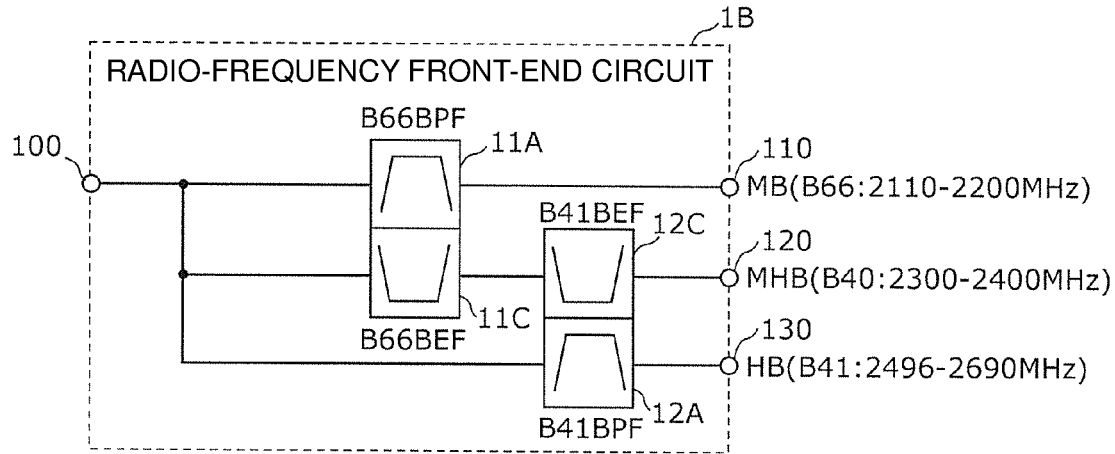
FIG. 7 is a specific circuit configuration diagram of a radio-frequency front-end circuit according to a second preferred embodiment of the present invention.

FIG. 7 is a specific circuit configuration diagram of the radio-frequency front-end circuit 1B according to the second preferred embodiment of the present invention. The radio-frequency front-end circuit 1B shown in FIG. 7 preferably includes the first filter 11A, a first band elimination filter 11C, the second filter 12A, a second band elimination filter 12C, the antenna common terminal 100, and the input-output terminals 110, 120, 130. The radio-frequency front-end circuit 1B is a multiplexer-demultiplexer circuit including the first filter 11A, the second filter 12A, and the pair of first band elimination filter 11C and second band elimination filter 12C, bound by the antenna common terminal 100. The radio-frequency front-end circuit 1B is an example in which the radio-frequency front-end circuit 1 is applied to an LTE receiver demultiplexer circuit.

In the radio-frequency front-end circuit 1B, the middle high band (MHB: about 2300 MHz-about 2400 MHz) is allocated as the third frequency band, the middle band (MB: about 2110 MHz-about 2200 MHz) is allocated as the first frequency band, and the high band (HB: about 2496 MHz-about 2690 MHz) is allocated as the second frequency band. That is, in ascending order of frequency, the first frequency band, the third frequency band, and the second frequency band are allocated.

The radio-frequency front-end circuit 1B according to the present preferred embodiment differs from the radio-frequency front-end circuit 1A according to the first preferred embodiment in the filter bandpass characteristics of each of the first band elimination filter and the second band elimination filter. Hereinafter, for the radio-frequency front-end circuit 1B, the description of the same points as those of the radio-frequency front-end circuit 1A is omitted, and different points will be mainly described.

Figure 8:
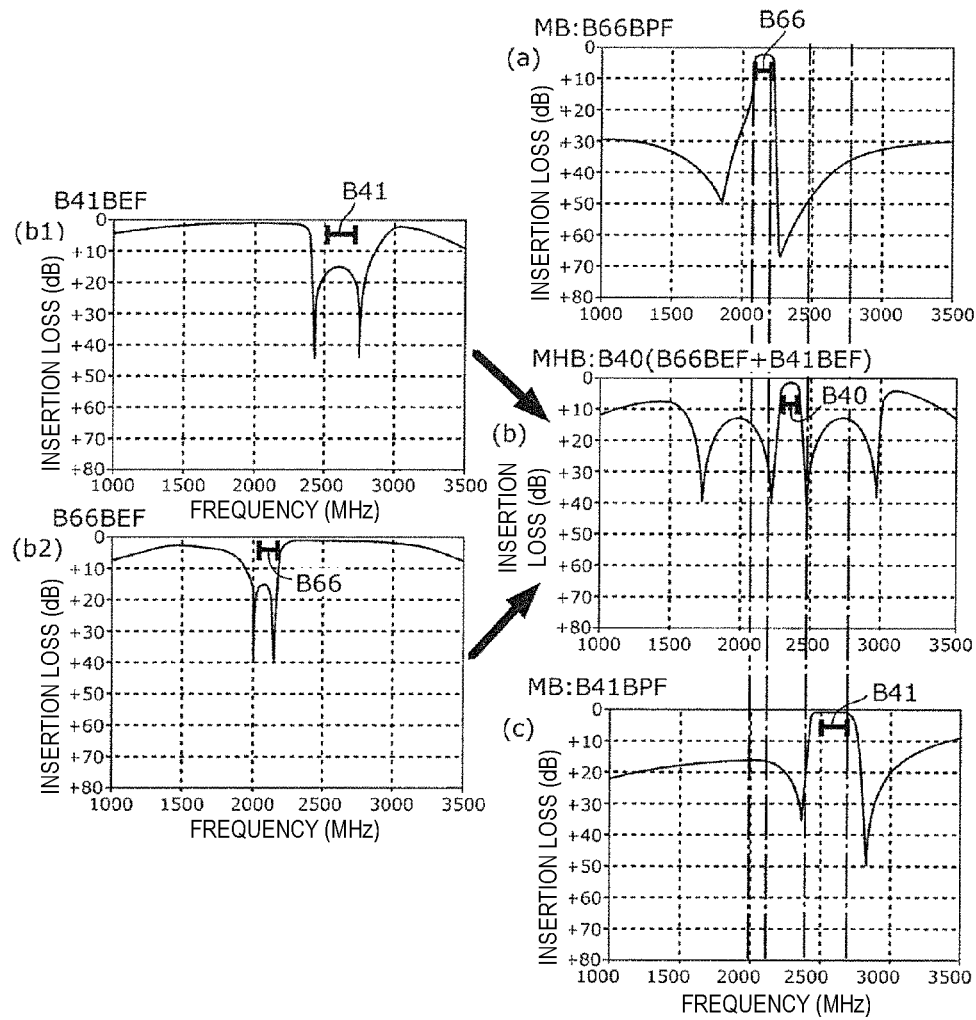
FIG. 8 shows graphs showing bandpass characteristics of filters of the radio-frequency front-end circuit according to the second preferred embodiment of the present invention.

FIG. 8 shows graphs showing the bandpass characteristics of the first filter 11A, first band elimination filter 11C, second filter 12A, and second band elimination filter 12C of the radio-frequency front-end circuit 1B according to the second preferred embodiment.

As shown in (a) of FIG. 8, the first filter 11A is a band pass filter that has filter bandpass characteristics that Band66 (about 2110 MHz-about 2200 MHz) is a pass band.

As shown in (c) of FIG. 8, the second filter 12A is a band pass filter that has filter bandpass characteristics that Band41 (about 2496 MHz-about 2690 MHz) is a pass band.

As shown in (b2) of FIG. 8, the first band elimination filter 11C is a band elimination filter that has filter bandpass characteristics that Band66 (about 2110 MHz-about 2200 MHz) is a stop band.

As shown in (b1) of FIG. 8, the second band elimination filter 12C is a band elimination filter that has filter bandpass characteristics that Band41 (about 2496 MHz-about 2690 MHz) is a stop band.

As shown in (b) of FIG. 8, a series connection circuit defined by the first band elimination filter 11C and the second band elimination filter 12C makes up a band pass filter. The band pass filter has filter bandpass characteristics that the middle high band (MLB: about 2300 MHz-about 2400 MHz) including Band40 is a pass band and Band66 (about 2110 MHz-about 2200 MHz) and Band41 (about 2496 MHz-about 2690 MHz) are stop bands. According to the present example of a preferred embodiment of the present invention, filters that pass the third frequency band of which the frequencies are between the first frequency band and the second frequency band is defined by the first band elimination filter 11C and the second band elimination filter 12C.

In the present example of a preferred embodiment of the present invention, the first band elimination filter 11C may be a band elimination filter having Band41 (about 2496 MHz-about 2690 MHz) as a stop band, and the second band elimination filter 12C may be a band elimination filter having Band66 (about 2110 MHz-about 2200 MHz) as a stop band. That is, the band elimination filter having Band41 as a stop band may be connected in a preceding stage (on the antenna common terminal 100 side), and the band elimination filter having Band66 as a stop band may be connected in a subsequent stage (on the input-output terminal 120 side).

In the radio-frequency front-end circuit 1B according to the present preferred embodiment, it is desirable that the reflection coefficient $\Gamma_{B66}$ of the first band elimination filter 11C in the first frequency band (preferably the Band66 pass band) when the first band elimination filter 11C is viewed from the antenna common terminal 100 side alone be larger than the reflection coefficient $\Gamma_{B41}$ of the second band elimination filter 12C in the second frequency band (preferably the Band41 pass band) when the second band elimination filter 12C is viewed from the antenna common terminal 100 side alone. Since the first band elimination filter 11C is connected closer to the antenna common terminal 100 than the second band elimination filter 12C, the binding loss of the first filter 11A due to the first band elimination filter 11C (the insertion loss of the first filter 11A due to the reflection coefficient of the first band elimination filter 11C) is larger than the binding loss of the second filter 12A due to the second band elimination filter 12C (the insertion loss of the second filter 12A due to the reflection coefficient of the second band elimination filter 12C). Therefore, when the reflection coefficient $\Gamma_{B66}$ of the first band elimination filter 11C in the first frequency band is made larger than the reflection coefficient $\Gamma_{B41}$ of the second band elimination filter 12C in the second frequency band, the binding loss of the radio-frequency front-end circuit 1B is effectively reduced.

Thus, since the binding loss of each of the first filter 11A and the second filter 12A is effectively reduced without disposing a switch between the antenna element and each of the first filter 11A and the second filter 12A, a small radio-frequency front-end circuit that is able to maintain low-loss signal propagation characteristics even during, for example, carrier aggregation (CA) operation is provided.

When the second band elimination filter 12C (the band elimination filter preferably having Band41 as a stop band) is connected in a preceding stage (on the antenna common terminal 100 side) and the first band elimination filter 11C (the band elimination filter preferably having Band66 as a stop band) is connected in a subsequent stage (on the input-output terminal 120 side), it is desirable that the reflection coefficient $\Gamma_{B41}$ of the second band elimination filter 12C in the second frequency band (preferably the Band41 pass band) when the second band elimination filter 12C is viewed from the antenna common terminal 100 side alone be larger than the reflection coefficient $\Gamma_{B66}$ of the first band elimination filter 11C in the first frequency band (preferably the Band66 pass band) when the first band elimination filter 11C is viewed from the antenna common terminal 100 side alone. Thus, the binding loss of the radio-frequency front-end circuit 1B is effectively reduced.

Third Preferred Embodiment

In the present preferred embodiment, a radio-frequency front-end circuit 1C applied to an LTE multiband system different from the system to which the radio-frequency front-end circuit 1A according to the first preferred embodiment is applied or the system to which the radio-frequency front-end circuit 1B according to the second preferred embodiment is applied will be described.

Figure 9:
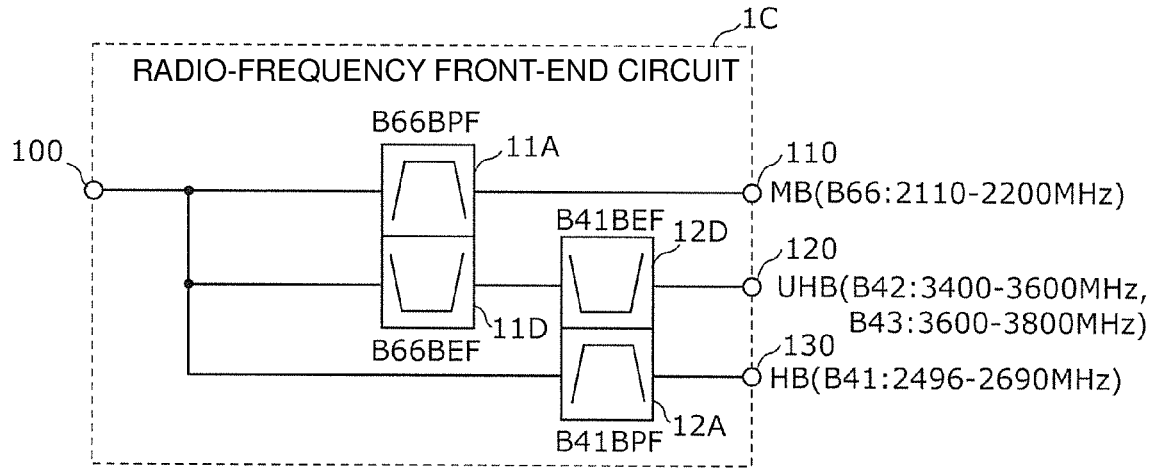
FIG. 9 is a specific circuit configuration diagram of a radio-frequency front-end circuit according to a third preferred embodiment of the present invention.

FIG. 9 is a specific circuit configuration diagram of the radio-frequency front-end circuit 1C according to the third preferred embodiment. The radio-frequency front-end circuit 1C shown in FIG. 9 preferably includes the first filter 11A, a first band elimination filter 11D, the second filter 12A, a second band elimination filter 12D, the antenna common terminal 100, and the input-output terminals 110, 120, 130. The radio-frequency front-end circuit 1C is preferably a multiplexer-demultiplexer circuit including the first filter 11A, the second filter 12A, and the pair of first band elimination filter 11D and second band elimination filter 12D, bound by the antenna common terminal 100. The radio-frequency front-end circuit 1C is an example in which the radio-frequency front-end circuit 1 is applied to an LTE receiver demultiplexer circuit.

In the radio-frequency front-end circuit 1C, an ultra high band (UHB: about 3400 MHz-about 3800 MHz) is allocated as the third frequency band, the middle band (MB: about 2110 MHz-about 2200 MHz) is allocated as the first frequency band, and the high band (HB: about 2496 MHz-about 2690 MHz) is allocated as the second frequency band. That is, in ascending order of frequency, the first frequency band, the second frequency band, and the third frequency band are allocated.

The radio-frequency front-end circuit 1C according to the present preferred embodiment preferably differs from the radio-frequency front-end circuit 1A according to the first preferred embodiment in the filter bandpass characteristics of each of the first band elimination filter and the second band elimination filter. Hereinafter, for the radio-frequency front-end circuit 1C, the description of the same points as those of the radio-frequency front-end circuit 1A is omitted, and different points will be mainly described.

Figure 10:
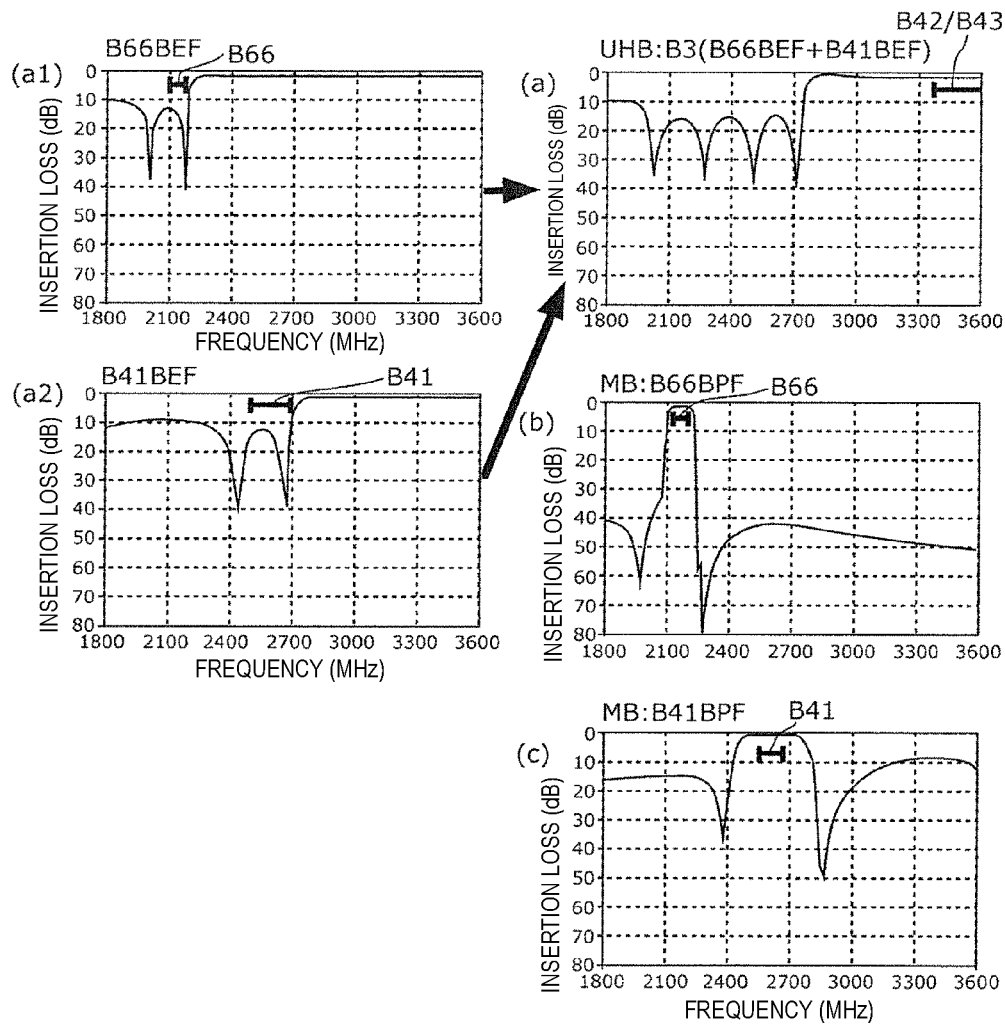
FIG. 10 shows graphs showing bandpass characteristics of filters of the radio-frequency front-end circuit according to the third preferred embodiment of the present invention.

FIG. 10 shows graphs showing the bandpass characteristics of the first filter 11A, first band elimination filter 11D, second filter 12A, and second band elimination filter 12D of the radio-frequency front-end circuit 1C according to the third preferred embodiment.

As shown in (b) of FIG. 10, the first filter 11A is a band pass filter that has filter bandpass characteristics that Band66 (about 2110 MHz-about 2200 MHz) is a pass band.

As shown in (c) of FIG. 10, the second filter 12A is a band pass filter that has filter bandpass characteristics that Band41 (about 2496 MHz-about 2690 MHz) is a pass band. As shown in (a1) of FIG. 10, the first band elimination filter 11D is a band elimination filter that has filter bandpass characteristics that Band66 (about 2110 MHz-about 2200 MHz) is a stop band.

As shown in (a2) of FIG. 10, the second band elimination filter 12D is a band elimination filter that has filter bandpass characteristics that Band41 (about 2496 MHz-about 2690 MHz) is a stop band.

As shown in (a) of FIG. 10, a series connection circuit defined by the first band elimination filter 11D and the second band elimination filter 12D makes up a high pass filter. The high pass filter has filter bandpass characteristics that the ultra high band (UHB: about 3400 MHz-about 3800 MHz), including the pair of Band42 and Band43, is a pass band and Band66 (about 2110 MHz-about 2200 MHz) and Band41 (about 2496 MHz-about 2690 MHz) are stop bands.

According to the present example of a preferred embodiment of the present invention, filters that pass the third frequency band of which the frequencies are higher than those of the first frequency band and second frequency band is defined by the first band elimination filter 11D and the second band elimination filter 12D.

In the present example of a preferred embodiment of the present invention, the first band elimination filter 11D may be a band elimination filter having Band41 (about 2496 MHz-about 2690 MHz) as a stop band, and the second band elimination filter 12D may be a band elimination filter having Band66 (about 2110 MHz-about 2200 MHz) as a stop band. That is, the band elimination filter having Band41 as a stop band may be connected in a preceding stage (i.e., on the antenna common terminal 100 side), and the band elimination filter having Band66 as a stop band may be connected in a subsequent stage (i.e., on the input-output terminal 120 side).

A series connection circuit defined by the first band elimination filter 11D and the second band elimination filter 12D may be defined by a high pass filter having only any one of Band42 (about 3400 MHz-about 3600 MHz) and Band43 (about 3600 MHz-about 3800 MHz) as a pass band.

In the radio-frequency front-end circuit 1C according to the present preferred embodiment, it is desirable that the reflection coefficient $\Gamma_{B66}$ of the first band elimination filter 11D in the first frequency band (preferably the Band66 pass band) when the first band elimination filter 11D is viewed from the antenna common terminal 100 side alone be larger than the reflection coefficient $\Gamma_{B41}$ of the second band elimination filter 12D in the second frequency band (preferably the Band41 pass band) when the second band elimination filter 12D is viewed from the antenna common terminal 100 side alone. Since the first band elimination filter 11D is connected closer to the antenna common terminal 100 than the second band elimination filter 12D, the binding loss of the first filter 11A due to the first band elimination filter 11D (the insertion loss of the first filter 11A due to the reflection coefficient of the first band elimination filter 11D) is larger than the binding loss of the second filter 12A due to the second band elimination filter 12D (the insertion loss of the second filter 12A due to the reflection coefficient of the second band elimination filter 12D). Therefore, when the reflection coefficient $\Gamma_{B66}$ of the first band elimination filter 11D in the first frequency band is made larger than the reflection coefficient $\Gamma_{B41}$ of the second band elimination filter 12D in the second frequency band, the binding loss of the radio-frequency front-end circuit 1C is effectively reduced.

Thus, since the binding losses of the first filter 11A and second filter 12A are effectively reduced without disposing a switch between the antenna element and each of the first filter 11A and the second filter 12A, a small radio-frequency front-end circuit that is able to maintain low-loss signal propagation characteristics even during, for example, carrier aggregation (CA) operation is provided.

When the second band elimination filter 12D (the band elimination filter having Band41 as a stop band) is connected in a preceding stage (on the antenna common terminal 100 side) and the first band elimination filter 11D (the band elimination filter having Band66 as a stop band) is connected in a subsequent stage (on the input-output terminal 120 side), it is desirable that the reflection coefficient $\Gamma_{B41}$ of the second band elimination filter 12D in the second frequency band (preferably the Band41 pass band) when the second band elimination filter 12D is viewed from the antenna common terminal 100 side alone be larger than the reflection coefficient $\Gamma_{B66}$ of the first band elimination filter 11D in the first frequency band (preferably the Band66 pass band) when the first band elimination filter 11D is viewed from the antenna common terminal 100 side alone. Thus, the binding loss of the radio-frequency front-end circuit 1C is effectively reduced.

Fourth Preferred Embodiment

In the first to third preferred embodiments described above, the description is made as follows. In the configuration that the first filter 11A, the second filter 12A, and the pair of first band elimination filter 11B and second band elimination filter 12B are bound by the antenna common terminal 100 and the first band elimination filter 11B and the second band elimination filter 12B are connected in series with each other, it is desirable that increasing the reflection coefficient take precedence in the first band elimination filter 11B that has a major effect on the reflection characteristics. In the second band elimination filter 12B that has a minor effect on the reflection characteristics, it is desirable that a configuration that ensures filter characteristics, such as bandpass characteristics, attenuation characteristics, temperature characteristics, and band width, be adopted. In the present preferred embodiment, from the above viewpoint, combinations of the structures of the first band elimination filter 11B and second band elimination filter 12B will be illustrated.

In the present preferred embodiment, the first band elimination filter 11B and the second band elimination filter 12B each may preferably be defined by an elastic wave resonator, and each may have a ladder filter structure. In this case, one or more elastic wave resonators disposed closer to the antenna common terminal 100 include at least one of a series arm resonator and a parallel arm resonator. Thus, the binding loss of the radio-frequency front-end circuit 1 is reduced while low loss characteristics of the first band elimination filter 11B and second band elimination filter 12B are ensured.

Alternatively, the first band elimination filter 11B and the second band elimination filter 12B each may have a longitudinally-coupled filter structure. Thus, the first band elimination filter 11B and the second band elimination filter 12B are allowed to be adapted to filter characteristics required for enhancement of attenuation or other purposes.

Examples of the structure of each elastic wave resonator include a SAW resonator, a solidly mounted resonator (SMR), and a film bulk acoustic resonator (FBAR) using BAW.

Hereinafter, a combination of a specific configuration that the reflection coefficient of the preceding first band elimination filter 11B is increased and a specific configuration that the filter characteristics, such as attenuation characteristics, temperature characteristics, and stop band width, of the subsequent second band elimination filter 12B are improved will be illustrated.

First, an example of the structure of each elastic wave resonator will be described.

Figure 11:
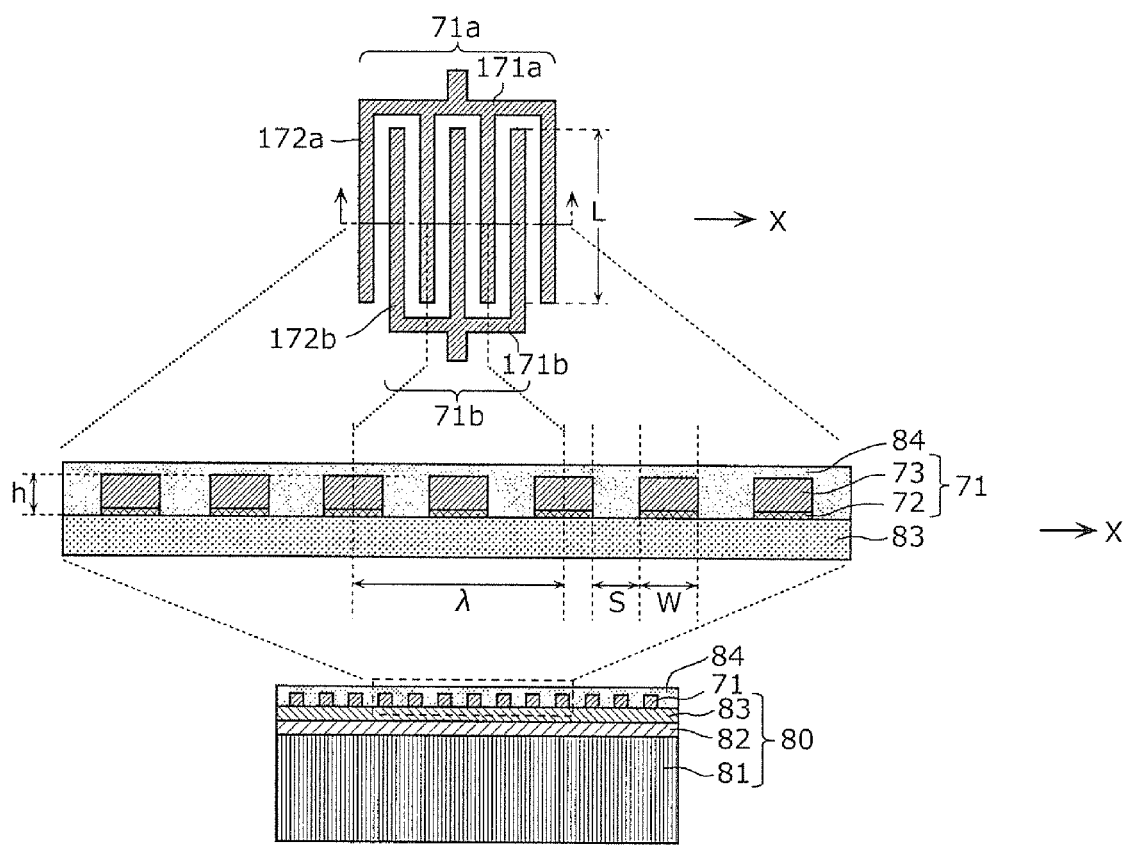
FIG. 11 shows examples of a plan view and cross-sectional view schematically showing a filter resonator according to a fourth preferred embodiment of the present invention.

FIG. 11 shows examples of a plan view and cross-sectional view schematically showing a filter resonator according to the fourth preferred embodiment. FIG. 11 shows a case where each of the elastic wave resonators (the series arm resonator and the parallel arm resonator) according to the present preferred embodiment are, for example, SAW resonators. In FIG. 11, among the plurality of resonators that define the first band elimination filter 11B and the second band elimination filter 12B, a schematic plan view and schematic cross-sectional view showing the structure of one of the elastic wave resonators are illustrated. The elastic wave resonator shown in FIG. 11 illustrates the preferred typical structure of each of the above-described plurality of resonators, and the number of electrode fingers that define the electrode, the length of each electrode finger, and the like, are not limited thereto.

Each of the resonators of the first band elimination filter 11B and second band elimination filter 12B is preferably defined by a substrate 80 and comb-shaped IDT electrodes 71a, 71b. The substrate 80 has a piezoelectric layer 83.

As shown in the plan view of FIG. 11, the pair of IDT electrodes 71a, 71b facing each other is provided on the piezoelectric layer 83. The IDT electrode 71a is preferably defined by a plurality of electrode fingers 172a and a busbar electrode 171a. The plurality of electrode fingers 172a are parallel or substantially parallel to one another. The busbar electrode 171a connects the plurality of electrode fingers 172a. The IDT electrode 71b is defined by a plurality of electrode fingers 172b and a busbar electrode 171b. The plurality of electrode fingers 172b is parallel to one another. The busbar electrode 171b connects the plurality of electrode fingers 172b. The pluralities of electrode fingers 172a, 172b are arranged along a direction perpendicular to an X-axis direction.

An IDT electrode 71 is preferably defined by the pluralities of electrode fingers 172a, 172b and the busbar electrodes 171a, 171b. As shown in the cross-sectional view of FIG. 11, the IDT electrode 71 has a multilayer structure of an adhesion layer 72 and a main electrode layer 73.

The adhesion layer 72 is a layer that improves adhesion between the piezoelectric layer 83 and the main electrode layer 73. For example, Ti is preferably used as the material of the adhesion layer 72. The film thickness of the adhesion layer 72 is preferably, for example, approximately 10 nm.

For example, Al containing 1% of Cu is preferably used as the material of the main electrode layer 73. The film thickness of the main electrode layer 73 is preferably, for example, approximately 130 nm.

A protective film 84 is provided so as to cover the IDT electrodes 71a, 71b. The protective film 84 is a layer intended to protect the main electrode layer 73 against external environments, to adjust frequency-temperature characteristics, to enhance moisture resistance, and the like. The protective film 84 is preferably, for example, a film containing silicon dioxide as a main ingredient. The film thickness of the protective film 84 is preferably, for example, approximately 30 nm.

The materials of the adhesion layer 72, main electrode layer 73, and protective film 84 are not limited to the above-described materials. Furthermore, the IDT electrode 71 does not need to have the above-described multilayer structure. The IDT electrode 71 may preferably be made of, for example, a metal, such as Ti, Al, Cu, Pt, Au, Ag, and Pd, or an alloy of the metal, or may be defined by a plurality of multilayer bodies made of the above-described metal or alloy. The protective film 84 does not need to be formed.

Next, the multilayer structure of the substrate 80 will be described.

As shown at the bottom of FIG. 11, the substrate 80 preferably includes a high acoustic velocity support substrate 81, a low acoustic velocity film 82, and the piezoelectric layer 83. The substrate 80 has a structure in which the high acoustic velocity support substrate 81, the low acoustic velocity film 82, and the piezoelectric layer 83 are laminated in this order (acoustic velocity film multilayer structure).

The piezoelectric layer 83 is preferably made of, for example, a 42-degree Y-cut X-propagation $LiTaO_3$ piezoelectric monocrystal or piezoelectric ceramics) (lithium tantalate monocrystal or ceramics cut along a plane having an axis rotated by 42 degrees from the Y-axis about the X-axis as the direction of the normal, and through which surface acoustic waves propagate in the X-axis direction). In this case, the elastic wave resonator uses leaky waves as elastic waves.

Alternatively, the piezoelectric layer 83 could be made of, for example, 128-degree Y-cut X-propagation $LiNbO_3$ piezoelectric monocrystal or piezoelectric ceramics. In this case, the elastic wave resonator uses Rayleigh waves as elastic waves.

Alternatively, the piezoelectric layer 83 could be made of, for example, Y-cut X-propagation $LiNbO_3$ piezoelectric monocrystal or piezoelectric ceramics. In this case, the elastic wave resonator uses Love waves as elastic waves.

The monocrystal material, Cut-Angles, and multilayer structure of the piezoelectric layer 83 are selected as needed for filter requirement specifications (filter characteristics, such as bandpass characteristics, attenuation characteristics, temperature characteristics, and band width), or other factors.

The high acoustic velocity support substrate 81 is preferably a substrate that supports the low acoustic velocity film 82, the piezoelectric layer 83, and the IDT electrode 71. Furthermore, the high acoustic velocity support substrate 81 is a substrate through which bulk waves propagate at a higher acoustic velocity than elastic waves, such as surface acoustic waves and boundary waves, propagate through the piezoelectric layer 83. The high acoustic velocity support substrate 81 operates to trap surface acoustic waves within a portion at which the piezoelectric layer 83 and the low acoustic velocity film 82 are laminated so that the surface acoustic waves are not leaked to below the high acoustic velocity support substrate 81. The high acoustic velocity support substrate 81 is preferably, for example, a silicon substrate, and has a thickness of, for example, about 200 µm. The high acoustic velocity support substrate 81 may preferably be made of any one of (1) a piezoelectric body, such as aluminum nitride, aluminum oxide, silicon carbide, silicon nitride, silicon, sapphire, lithium tantalate, lithium niobate, and crystal, (2) various ceramics, such as alumina, zirconia, cordierite, mullite, steatite, and forsterite, (3) magnesia diamond, (4) a material containing any one of the above-described materials as a main ingredient, and (5) a material containing a mixture of some of the above-described materials as a main ingredient.

The low acoustic velocity film 82 is a film through which bulk waves propagate at a lower acoustic velocity than elastic waves propagate through the piezoelectric layer 83. The low acoustic velocity film 82 is disposed between the piezoelectric layer 83 and the high acoustic velocity support substrate 81. With this structure and the property that the energy of elastic waves essentially concentrates in a low acoustic velocity medium, leakage of surface acoustic wave energy to the outside of the IDT electrode is reduced. The low acoustic velocity film 82 is a film containing, for example, silicon dioxide as a main ingredient. The thickness of the low acoustic velocity film 82 is preferably, for example, approximately 500 nm.

With the acoustic velocity film multilayer structure of the substrate 80, as compared to the existing structure that uses a piezoelectric substrate in a single layer, quality factors in resonant frequency and anti-resonant frequency are significantly increased. That is, a surface acoustic wave resonator having a high quality factor can be made, so a filter having a small insertion loss is allowed to be made by using the surface acoustic wave resonator.

The high acoustic velocity support substrate 81 may have a structure that a support substrate and a high acoustic velocity film are laminated. Bulk waves propagate through the high acoustic wave velocity film at a higher acoustic velocity than elastic waves, such as surface acoustic waves and boundary waves, propagate through the piezoelectric layer 83. In this case, the support substrate may preferably be made from a piezoelectric body, such as sapphire, lithium tantalate, lithium niobate, and crystal, various ceramics, such as alumina, magnesia, silicon nitride, aluminum nitride, silicon carbide, zirconia, cordierite, mullite, steatite, and forsterite, a dielectric, such as glass, or a semiconductor, such as silicon and gallium nitride, a resin substrate, or the like. Various high acoustic velocity materials may be used for the high acoustic velocity film. Examples of the various high acoustic velocity materials include, for example, aluminum nitride, aluminum oxide, silicon carbide, silicon nitride, silicon oxynitride, a DLC film, diamond, a medium containing any one of the above-described materials as a main ingredient, and a medium containing a mixture of some of the above-described materials as a main ingredient.

The example in which the IDT electrode 71 of the elastic wave resonator is provided on the substrate 80 including the piezoelectric layer 83 is described. Instead, a substrate on which the IDT electrode 71 is provided may be a piezoelectric substrate defined by the single piezoelectric layer 83. The piezoelectric substrate in this case is made from, for example, a piezoelectric monocrystal of $LiTaO_3$ or another piezoelectric monocrystal, such as $LiNbO_3$.

As long as the substrate on which the IDT electrode 71 is formed has the piezoelectric layer 83, not only the entire substrate is defined by a piezoelectric layer but also the substrate may have a structure that a piezoelectric layer is laminated on the support substrate.

Desired parameters of the IDT electrode 71 will be described. The wave length of the surface acoustic wave resonator is regulated by a wave length λ that is a cycle period of the plurality of electrode fingers 172a or the plurality of electrode fingers 172b that define the IDT electrode 71 shown at the middle of FIG. 11. The electrode fingers pitch is a half of the wave length λ. Where the line width of each of the electrode fingers 172a, 172b that define the IDT electrodes 71a, 71b is W and a space width between any adjacent electrode finger 172a and electrode fingers 172b is S, the electrode pitch is defined as (W+S). As shown at the top of FIG. 11, the overlap width L of the IDT electrode is an electrode finger length by which the electrode fingers 172a of the IDT electrode 71a and the electrode fingers 172b of the IDT electrode 71b overlap each other when viewed in the X-axis direction. The electrode duty of each resonator is the occupancy of the line widths of the pluralities of electrode fingers 172a, 172b, and is the proportion of the line widths to an added value of the line widths of the pluralities of electrode fingers 172a, 172b and the space widths between the pluralities of electrode fingers 172a, 172b. The electrode duty is defined by W/(W+S).

Hereinafter, a combination of the specific configuration that the reflection coefficient of the first band elimination filter 11B is increased and the specific configuration that the filter characteristics, such as attenuation characteristics, temperature characteristics, and stop band width, of the second band elimination filter 12B are improved will be illustrated.

Figures 12A, 12B:
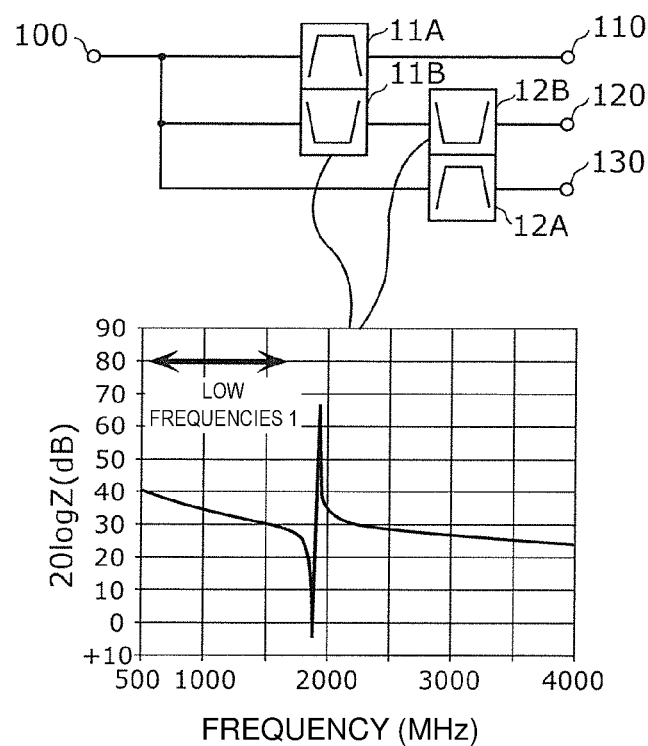
FIG. 12A is a view illustrating reflection characteristics at low frequencies 1 of each band elimination filter according to the fourth preferred embodiment of the present invention.
FIG. 12B is a table showing combinations of configurations of the band elimination filters according to the fourth preferred embodiment of the present invention.

FIG. 12A is a view illustrating reflection characteristics at low frequencies 1 of each band elimination filter according to the fourth preferred embodiment. As shown at the bottom of the drawing, in impedance characteristics of each elastic wave resonator of each of the band elimination filters, a resonance point at which the impedance is a local minimum and an antiresonance point at which the impedance is a local maximum are identified near the stop band. In a lower frequency range than the resonance point (low frequencies 1 in FIG. 12A), the impedance varies with the structure of each elastic wave resonator, and whether the reflection characteristics are high or low depends on the magnitude of the impedance. More specifically, a structure that uses any one of (1) Rayleigh waves that propagate through a piezoelectric layer made of $LiNbO_3$, (2) leaky waves that propagate through a piezoelectric layer made of $LiTaO_3$, and (3) Love waves that propagate through a piezoelectric layer made of $LiNbO_3$ as surface acoustic waves or (4) the above-described acoustic velocity film multilayer structure is larger in reflection coefficient at low frequencies 1 than an SMR or an FBAR.

FIG. 12B is a table showing combinations of configurations of the first band elimination filter 11B and second band elimination filter 12B according to the fourth preferred embodiment.

With the above-described reflection coefficient relationship, when the third frequency band that is the pass band of the series connection circuit defined by the first band elimination filter 11B and the second band elimination filter 12B is located at higher frequencies than the pass band (first frequency band) of the first filter 11A and the pass band (second frequency band) of the second filter 12A (for example, in the case of the radio-frequency front-end circuit 1C according to the third preferred embodiment), in the radio-frequency front-end circuit according to the present preferred embodiment, the first band elimination filter 11B may have a structure that uses any one of (1) Rayleigh waves that propagate through a piezoelectric layer made of $LiNbO_3$, (2) leaky waves that propagate through a piezoelectric layer made of $LiTaO_3$, and (3) Love waves that propagate through a piezoelectric layer made of $LiNbO_3$ as surface acoustic waves, as shown in FIG. 12B.

Thus, when the series connection circuit defined by the first band elimination filter 11B and the second band elimination filter 12B is a higher frequency filter and the first filter 11A and the second filter 12A are lower frequency filters, the reflection coefficient of the first band elimination filter 11B in the second frequency band in the case where the first band elimination filter 11B uses elastic waves of any one of the above-described (1), (2), and (3) is larger than the reflection coefficient in the case where the first band elimination filter 11B uses other elastic waves. As a result, the binding loss of the second filter 12A is reduced.

On the other hand, in the second band elimination filter 12B, each elastic wave resonator may be an SMR or an FBAR.

Thus, while the reflection coefficient of the first band elimination filter 11B in the second frequency band is increased, steepness of the stop band of the filter circuit defined by the first band elimination filter 11B and the second band elimination filter 12B is ensured with the above-described configuration of the second band elimination filter 12B.

As shown in FIG. 12B, each elastic wave resonator of the first band elimination filter 11B may have the above-described acoustic velocity film multilayer structure, and each elastic wave resonator of the second band elimination filter 12B may be an SMR or an FBAR.

Thus, in the radio-frequency front-end circuit, as compared to when the first band elimination filter 11B uses an SMR or an FBAR, the reflection coefficient of the first band elimination filter 11B in the second frequency band is increased. As a result, the binding loss of the second filter 12A is reduced. In addition, with the above-described configuration of the second band elimination filter 12B, steepness of the stop band of the filter circuit defined by the first band elimination filter 11B and the second band elimination filter 12B is ensured.

When the second band elimination filter 12B is connected in a preceding stage (on the antenna common terminal 100 side) and the first band elimination filter 11B is connected in a subsequent stage (on the input-output terminal 120 side), it is desirable that the second band elimination filter 12B have a structure that uses any one of (1) Rayleigh waves that propagate through a piezoelectric layer made of LiNbO$_3$, (2) leaky waves that propagate through a piezoelectric layer made of LiTaO$_3$, and (3) Love waves that propagate through a piezoelectric layer made of LiNbO$_3$ as surface acoustic wave.

Thus, when the series connection circuit defined by the first band elimination filter 11B and the second band elimination filter 12B is a higher frequency filter and the first filter 11A and the second filter 12A are lower frequency filters, the reflection coefficient of the second band elimination filter 12B in the first frequency band in the case where the second band elimination filter 12B uses any one of the above-described (1), (2), and (3) is larger than the reflection coefficient in the case where the second band elimination filter 12B uses other elastic waves. Thus, the binding loss of the first filter 11A is reduced.

FIG. 13A is a view illustrating bulk wave leakage at high frequencies 1 of each band elimination filter according to a first alternative preferred embodiment to the fourth preferred embodiment. As shown at the bottom of the drawing, in a higher frequency range than the antiresonance point of the elastic wave resonator (high frequencies 1 in FIG. 13A), an impedance change due to bulk wave leakage (unnecessary waves) appears, and whether the reflection characteristics are high or low depends on the impedance change. More specifically, the reflection coefficient due to bulk wave leakage at high frequencies 1 reduces in order of (1) a structure that uses Rayleigh waves that propagate through a piezoelectric layer made of LiNbO$_3$ as elastic waves, an SMR, an FBAR, (2) an acoustic velocity film multilayer structure, (3) a structure that uses leaky waves that propagate through a piezoelectric layer made of LiTaO$_3$ as elastic waves, and (4) a structure that uses Love waves that propagate through a piezoelectric layer made of LiNbO$_3$ as elastic waves.

FIG. 13B is a table showing combinations of configurations of the first band elimination filter 11B and second band elimination filter 12B according to the first alternative preferred embodiment to the fourth preferred embodiment.

Based on the order in which the reflection coefficient is high or low, when the third frequency band that is the pass band of the series connection circuit defined by the first band elimination filter 11B and the second band elimination filter 12B is located at lower frequencies than the pass band of the first filter 11A (first frequency band) and the pass band of the second filter 12A (second frequency band) (for example, in the case of the radio-frequency front-end circuit 1A according to the first preferred embodiment), the first band elimination filter 11B may have any one of (1) a structure that uses Rayleigh waves that propagate through a piezoelectric layer made of LiNbO$_3$ as surface acoustic waves, (2) each elastic wave resonator is an SMR, and (3) each elastic wave resonator is an FBAR, as shown in FIG. 13B.

Thus, when the series connection circuit defined by the first band elimination filter 11B and the second band elimination filter 12B is a lower frequency filter and the first filter 11A and the second filter 12A are higher frequency filters, the reflection coefficient of the first band elimination filter 11B in the second frequency band in the case where the first band elimination filter 11B uses elastic waves of any one of the above-described (1), (2), and (3) is larger than the reflection coefficient in the case where the first band elimination filter 11B uses other elastic waves. As a result, the binding loss of the second filter 12A is reduced.

On the other hand, the second band elimination filter 12B may have any one of (1) the above-described acoustic velocity film multilayer structure, (2) a structure that uses leaky waves that propagate through a piezoelectric layer made of LiTaO$_3$ as surface acoustic waves, and (3) a structure that uses Love waves that propagate through a piezoelectric layer made of LiNbO$_3$ as surface acoustic waves.

Thus, while the reflection coefficient of the first band elimination filter 11B in the second frequency band is increased, good temperature characteristics of the second band elimination filter 12B are ensured when the second band elimination filter 12B has the acoustic velocity film multilayer structure. Alternatively, when the second band elimination filter 12B uses Love waves on LiNbO$_3$ as surface acoustic waves, a wide stop band width of the second band elimination filter 12B is ensured.

As shown in FIG. 13B, each elastic wave resonator of the first band elimination filter 11B may preferably have the above-described acoustic velocity film multilayer structure, and the second band elimination filter 12B may preferably have (1) a structure that uses leaky waves that propagate through a piezoelectric layer made of LiTaO$_3$ as surface acoustic waves or (2) a structure that uses Love waves that propagate through a piezoelectric layer made of LiNbO$_3$ as surface acoustic waves.

Thus, in the radio-frequency front-end circuit, as compared to when the first band elimination filter 11B uses surface acoustic waves of the above-described (1) or (2), the reflection coefficient of the first band elimination filter 11B in the second frequency band is increased. As a result, the binding loss of the second filter 12A is reduced. Furthermore, when the second band elimination filter 12B uses Love waves on LiNbO$_3$ as surface acoustic waves, a wide stop band width of the filter circuit defined by the first band elimination filter 11B and the second band elimination filter 12B is ensured.

Alternatively, the first band elimination filter 11B may have a structure that uses leaky waves that propagate through a piezoelectric layer made of LiTaO₃ as surface acoustic waves, and the second band elimination filter 12B may have a structure that uses Love waves that propagate through a piezoelectric layer made of LiNbO₃ as surface acoustic waves.

Thus, in the radio-frequency front-end circuit, as compared to when the first band elimination filter 11B does not use leaky waves that propagate through a piezoelectric layer made of LiTaO₃ as surface acoustic waves, the reflection coefficient of the first band elimination filter 11B in the second frequency band is increased. As a result, the binding loss of the second filter 12A is reduced. Furthermore, when the second band elimination filter 12B uses Love waves on LiNbO₃ as surface acoustic waves, a wide stop band width of the filter circuit defined by the first band elimination filter 11B and the second band elimination filter 12B is ensured.

When the second band elimination filter 12B is connected in a preceding stage (on the antenna common terminal 100 side) and the first band elimination filter 11B is connected in a subsequent stage (on the input-output terminal 120 side), it is desirable that the second band elimination filter 12B have any one of (1) a structure that uses Rayleigh waves that propagate through a piezoelectric layer made of LiNbO₃ as surface acoustic waves, (2) each elastic wave resonator is an SMR, and (3) each elastic wave resonator is an FBAR.

Thus, when the series connection circuit defined by the first band elimination filter 11B and the second band elimination filter 12B is a lower frequency filter and the first filter 11A and the second filter 12A are higher frequency filters, the reflection coefficient of the second band elimination filter 12B in the first frequency band in the case where the second band elimination filter 12B uses elastic waves of any one of the above-described (1), (2), and (3) is larger than the reflection coefficient in the case where the second band elimination filter 12B uses other elastic waves. As a result, the binding loss of the first filter 11A is reduced.

Figures 14A, 14B:
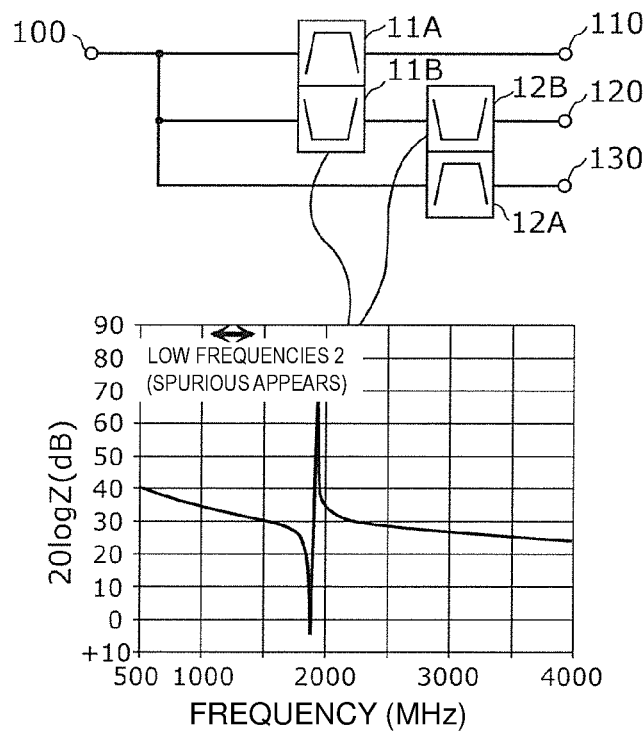
FIG. 14A is a view illustrating spurious waves that appears at low frequencies 2 of each band elimination filter according to a second alternative preferred embodiment to the fourth preferred embodiment of the present invention.
FIG. 14B is a table showing combinations of configurations of the band elimination filters according to the second alternative preferred embodiment to the fourth preferred embodiment of the present invention.

FIG. 14A is a view illustrating spurious waves frequencies that appear at low frequencies 2 of each band elimination filter according to a second alternative preferred embodiment to the fourth preferred embodiment. As shown at the bottom of the drawing, in a lower frequency range than the resonance point of each elastic wave resonator (low frequencies 2 in FIG. 14A), particularly, in the above-described acoustic velocity film multilayer structure or a structure that uses leaky waves that propagate through a piezoelectric layer made of LiTaO₃ as elastic waves, spurious waves of Rayleigh waves appears around 0.76 times of the resonant frequency. The impedance changes as the spurious waves appears, and the reflection coefficient reduces with the change in impedance.

FIG. 14B is a table showing combinations of configurations of the first band elimination filter 11B and second band elimination filter 12B according to the second alternative preferred embodiment to the fourth preferred embodiment.

When the third frequency band that is the pass band of the series connection circuit defined by the first band elimination filter 11B and the second band elimination filter 12B is located at higher frequencies than the pass band of the first filter 11A (first frequency band) and the pass band of the second filter 12A (second frequency band) (for example, in the case of the radio-frequency front-end circuit 1C according to the third preferred embodiment), the first band elimination filter 11B may have any one of (1) a structure that uses Rayleigh waves that propagate through a piezoelectric layer made of LiNbO₃ as surface acoustic waves, (2) a structure that uses leaky waves that propagate through a piezoelectric layer made of LiTaO₃ as surface acoustic waves, (3) a structure that uses Love waves that propagate through a piezoelectric layer made of LiNbO₃ as surface acoustic waves, (4) each elastic wave resonator is an SMR, and (5) each elastic wave resonator is an FBAR, and each elastic wave resonator of the second band elimination filter 12B may have the above-described acoustic velocity film multilayer structure, as shown in FIG. 14B.

That is, when the second band elimination filter 12B has the acoustic velocity film multilayer structure and the first band elimination filter 11B does not have the acoustic velocity film multilayer structure, the reflection coefficient of the first band elimination filter 11B in the second frequency band is increased. Thus, in the radio-frequency front-end circuit, the binding loss of the second filter 12A is reduced.

Alternatively, as shown in FIG. 14B, the first band elimination filter 11B may have any one of (1) a structure that uses Rayleigh waves that propagate through a piezoelectric layer made of LiNbO₃ as surface acoustic waves, (2) a structure that uses Love waves that propagate through a piezoelectric layer made of LiNbO₃ as surface acoustic waves, (3) the above-described acoustic velocity film multilayer structure, (4) each elastic wave resonator is an SMR, and (5) each elastic wave resonator is an FBAR, and the second band elimination filter 12B may have a structure that uses leaky waves that propagate through a piezoelectric layer made of LiTaO₃ as surface acoustic waves.

That is, when the second band elimination filter 12B uses leaky waves on LiTaO₃ as elastic waves, and the first band elimination filter 11B does not use leaky waves on LiTaO₃ as elastic waves, the reflection coefficient of the first band elimination filter 11B in the second frequency band is increased. Thus, in the radio-frequency front-end circuit, the binding loss of the second filter 12A is reduced.

When the second band elimination filter 12B is connected in a preceding stage (on the antenna common terminal 100 side) and the first band elimination filter 11B is connected in a subsequent stage (on the input-output terminal 120 side), it is desirable that the second band elimination filter 12B have any one of (1) a structure that uses Rayleigh waves that propagate through a piezoelectric layer made of LiNbO₃ as surface acoustic waves, (2) a structure that uses leaky waves that propagate through a piezoelectric layer made of LiTaO₃ as surface acoustic waves, (3) a structure that uses Love waves that propagate through a piezoelectric layer made of LiNbO₃ as surface acoustic waves, (4) each elastic wave resonator is an SMR, and (5) each elastic wave resonator is an FBAR and each elastic wave resonator of the first band elimination filter 11B have the above-described acoustic velocity film multilayer structure.

That is, when the first band elimination filter 11B has the acoustic velocity film multilayer structure and the second band elimination filter 12B does not have the acoustic velocity film multilayer structure, the reflection coefficient of the second band elimination filter 12B in the first frequency band is increased. Thus, in the radio-frequency front-end circuit, the binding loss of the first filter 11A is reduced.

Figures 15A, 15B:
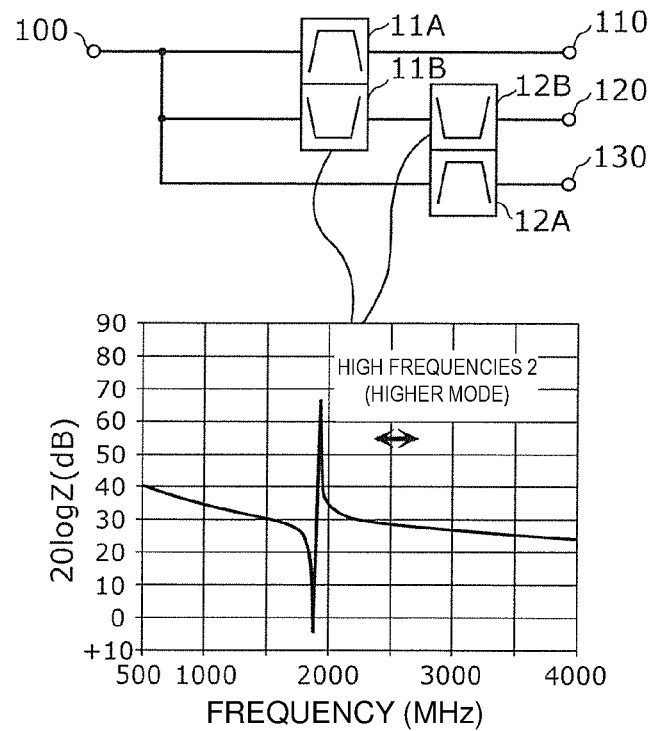
FIG. 15A is a view illustrating a higher mode that appears at high frequencies 2 of each band elimination filter according to a third alternative preferred embodiment to the fourth preferred embodiment of the present invention.
FIG. 15B is a table showing combinations of configurations of the band elimination filters according to the third alternative preferred embodiment to the fourth preferred embodiment of the present invention.

FIG. 15A is a view illustrating a higher mode that appears at high frequencies 2 of each band elimination filter according to a third alternative preferred embodiment to the fourth preferred embodiment. As shown at the bottom of the drawing, in a higher frequency range than the resonance point of each elastic wave resonator (high frequencies 2 in FIG. 15A), particularly, in a structure that uses Rayleigh waves that propagate through a piezoelectric layer made of LiNbO$_3$ as surface acoustic waves or a structure that uses Love waves that propagate through a piezoelectric layer made of LiNbO$_3$ as surface acoustic waves, a higher mode appears around 1.2 times of the resonant frequency. The impedance changes as a higher mode appears, and the reflection coefficient reduces with the change in impedance. FIG. 15B is a table showing combinations of configurations of the first band elimination filter 11B and second band elimination filter 12B according to the third alternative preferred embodiment to the fourth preferred embodiment.

When the third frequency band that is the pass band of the series connection circuit defined by the first band elimination filter 11B and the second band elimination filter 12B is located at lower frequencies than the pass band of the first filter 11A (first frequency band) and the pass band of the second filter 12A (second frequency band) (for example, in the case of the radio-frequency front-end circuit 1A according to the first preferred embodiment), the first band elimination filter 11B may have any one of (1) the above-described acoustic velocity film multilayer structure, (2) a structure that uses leaky waves that propagate through a piezoelectric layer made of LiTaO$_3$ as surface acoustic waves, (3) a structure that uses Love waves that propagate through a piezoelectric layer made of LiNbO$_3$ as surface acoustic waves, (4) an SMR, and (5) an FBAR, and the second band elimination filter 12B may have a structure that uses Rayleigh waves that propagate through a piezoelectric layer made of LiNbO$_3$ as surface acoustic waves, as shown in FIG. 15B.

That is, when the second band elimination filter 12B uses Rayleigh waves on LiNbO$_3$ as elastic waves and the first band elimination filter 11B does not use Rayleigh waves on LiNbO$_3$ as elastic waves, the reflection coefficient of the first band elimination filter 11B in the second frequency band is increased. Thus, in the radio-frequency front-end circuit, the binding loss of the second filter 12A is reduced.

Alternatively, as shown in FIG. 15B, the first band elimination filter 11B may have any one of (1) a structure that uses Rayleigh waves that propagate through a piezoelectric layer made of LiNbO$_3$ as surface acoustic waves, (2) the above-described acoustic velocity film multilayer structure, (3) a structure that uses leaky waves that propagate through a piezoelectric layer made of LiTaO$_3$ as surface acoustic waves, (4) an SMR, and (5) an FBAR, and the second band elimination filter 12B may have a structure that uses Love waves that propagate through a piezoelectric layer made of LiNbO$_3$ as surface acoustic waves. That is, when the second band elimination filter 12B uses Love waves on LiNbO$_3$ as elastic waves and the first band elimination filter 11B does not use Love waves on LiNbO$_3$ as elastic waves, the reflection coefficient of the first band elimination filter 11B in the second frequency band is increased. Thus, in the radio-frequency front-end circuit, the binding loss of the second filter 12A is reduced.

When the second band elimination filter 12B is connected in a preceding stage (on the antenna common terminal 100 side) and the first band elimination filter 11B is connected in a subsequent stage (on the input-output terminal 120 side), the second band elimination filter 12B may have any one of (1) the above-described acoustic velocity film multilayer structure, (2) a structure that uses leaky waves that propagate through a piezoelectric layer made of LiTaO$_3$ as surface acoustic waves, (3) a structure that uses Love waves that propagate through a piezoelectric layer made of LiNbO$_3$ as surface acoustic waves, (4) an SMR, and (5) an FBAR, and the first band elimination filter 11B may have a structure that uses Rayleigh waves that propagate through a piezoelectric layer made of LiNbO$_3$ as surface acoustic waves.

That is, when the first band elimination filter 11B uses Rayleigh waves on LiNbO$_3$ as elastic waves and the second band elimination filter 12B does not use Rayleigh waves on LiNbO$_3$ as elastic waves, the reflection coefficient of the second band elimination filter 12B in the first frequency band is increased. Thus, in the radio-frequency front-end circuit, the binding loss of the first filter 11A is reduced.

Figures 16A, 16B:
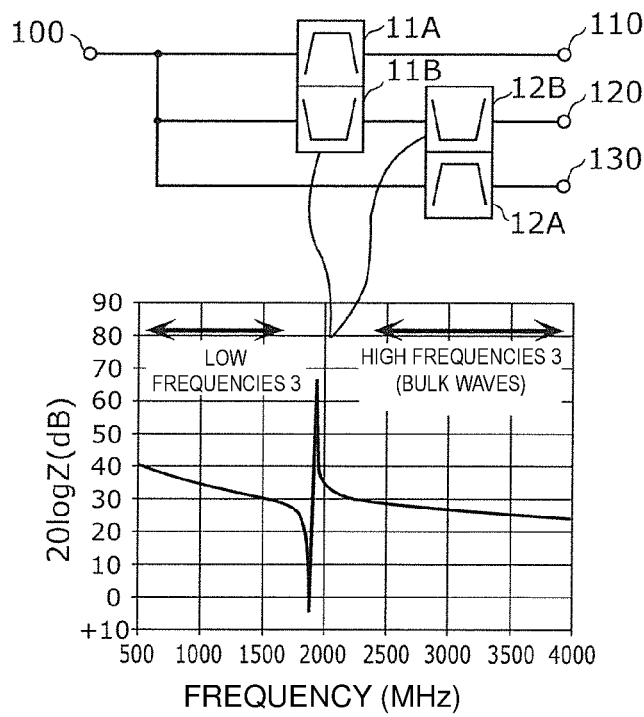
FIG. 16A characteristics at low frequencies 3 and bulk wave leakage at high frequencies 3 of each band elimination filter according to a fourth alternative preferred embodiment to the fourth preferred embodiment of the present invention.
FIG. 16B is a table showing combinations of configurations of the band elimination filters according to the fourth alternative preferred embodiment to the fourth preferred embodiment of the present invention.

FIG. 16A is a view illustrating reflection characteristics at low frequencies 3 and bulk wave leakage at high frequencies of each band elimination filter according to a fourth alternative preferred embodiment to the fourth preferred embodiment. As shown at the bottom of the drawing, in a lower frequency range than the resonance point (low frequencies 3 in FIG. 16A), the impedance varies with the structure of each elastic wave resonator, and whether the reflection characteristics are high or low depends on the magnitude of the impedance. In addition, in a higher frequency range than the antiresonance point of each elastic wave resonator (high frequencies 3 in FIG. 16A), an impedance change due to bulk wave leakage (unnecessary waves) appears, and whether the reflection characteristics are high or low depends on the impedance change.

More specifically, the reflection coefficient at low frequencies 3 in the case where the structure uses any one of (1) Rayleigh waves that propagate through a piezoelectric layer made of LiNbO$_3$, (2) leaky waves that propagate through a piezoelectric layer made of LiTaO$_3$, and (3) Love waves that propagate through a piezoelectric layer made of LiNbO$_3$ as surface acoustic waves, or (4) the above-described acoustic velocity film multilayer structure is larger than the reflection coefficient in the case of an SMR or an FBAR.

The reflection coefficient due to bulk wave leakage at high frequencies 3 reduces in order of (1) a structure that uses Rayleigh waves that propagate through a piezoelectric layer made of LiNbO$_3$ as elastic waves, an SMR, an FBAR, (2) the acoustic velocity film multilayer structure, (3) a structure that uses leaky waves that propagate through a piezoelectric layer made of LiTaO$_3$ as elastic waves, and (4) a structure that uses Love waves that propagate through a piezoelectric layer made of LiNbO$_3$ as elastic waves.

FIG. 16B is a table showing combinations of configurations of the first band elimination filter 11B and second band elimination filter 12B according to the fourth alternative preferred embodiment to the fourth preferred embodiment.

Based on the ranking of the reflection coefficient, when the third frequency band that is the pass band of the series connection circuit defined by the first band elimination filter 11B and the second band elimination filter 12B lies between the pass band of the first filter 11A (first frequency band) and the pass band of the second filter 12A (second frequency band) (for example, in the case of the radio-frequency front-end circuit 1B according to the second preferred embodiment), the first band elimination filter 11B may have a structure that uses Rayleigh waves that propagate through a piezoelectric layer made of LiNbO$_3$ as surface acoustic waves, and the second band elimination filter 12B may have any one of (1) the above-described acoustic velocity film multilayer structure, (2) a structure that uses leaky waves that propagate through a piezoelectric layer made of LiTaO$_3$ as surface acoustic waves, (3) a structure that uses Love waves that propagate through a piezoelectric layer made of LiNbO$_3$ as surface acoustic waves, and (4) an SMR or an FBAR, as shown in FIG. 16B. Thus, the binding loss of the first filter 11A or the second filter 12A is reduced.

Alternatively, as shown in FIG. 16B, the first band elimination filter 11B may have the above-described acoustic velocity film multilayer structure, and the second band elimination filter 12B may have any one of (1) a structure that uses leaky waves that propagate through a piezoelectric layer made of LiTaO$_3$ as surface acoustic waves, (2) a structure that uses Love waves that propagate through a piezoelectric layer made of LiNbO$_3$ as surface acoustic waves, and (3) an SMR or an FBAR. Thus, the binding loss of the first filter 11A or the second filter 12A is reduced.

When the second band elimination filter 12B is connected in a preceding stage (on the antenna common terminal 100 side) and the first band elimination filter 11B is connected in a subsequent stage (on the input-output terminal 120 side), the second band elimination filter 12B may have a structure that uses Rayleigh waves that propagate through a piezoelectric layer made of LiNbO$_3$ as surface acoustic waves, and the first band elimination filter 11B may have any one of (1) the above-described acoustic velocity film multilayer structure, (2) a structure that uses leaky waves that propagate through a piezoelectric layer made of LiTaO$_3$ as surface acoustic waves, (3) a structure that uses Love waves that propagate through a piezoelectric layer made of LiNbO$_3$ as surface acoustic waves, and (4) an SMR or an FBAR. Thus, the binding loss of the first filter 11A or the second filter 12A is reduced.

Figures 17A, 17B:
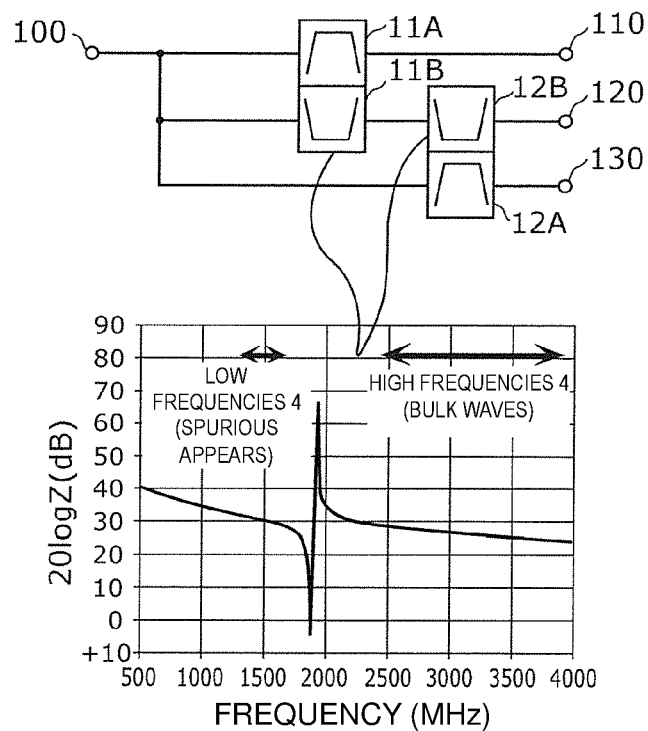
FIG. 17A is a view illustrating spurious waves that appears at low frequencies 4 and bulk wave leakage at high frequencies 4 of each band elimination filter according to a fifth alternative preferred embodiment to the fourth preferred embodiment of the present invention.
FIG. 17B is a table showing combinations of configurations of the band elimination filters according to the fifth alternative preferred embodiment to the fourth preferred embodiment of the present invention.
Figure 21:
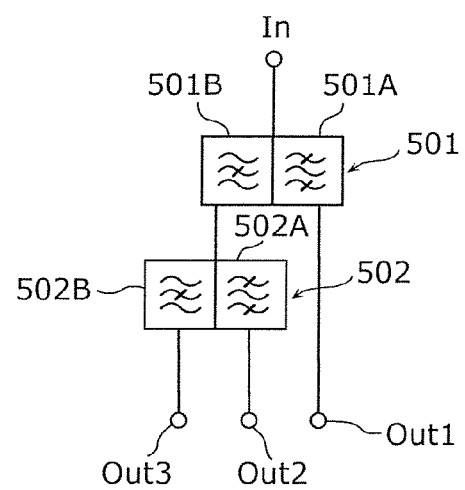
FIG. 21 is a circuit configuration diagram of a conventional electric circuit described in Japanese Unexamined Patent Application Publication (Translation of PCT Application) No. 2007-511145.

FIG. 17A is a view illustrating reflection characteristics due to spurious waves that appear at low frequencies 4 and bulk wave leakage at high frequencies 4 of each band elimination filter according to a fifth alternative preferred embodiment to the fourth preferred embodiment. As shown at the bottom of the drawing, in a lower frequency range than the resonance point of each elastic wave resonator (low frequencies 4 in FIG. 17A), particularly, in the above-described acoustic velocity film multilayer structure or a structure that uses leaky waves that propagate through a piezoelectric layer made of LiTaO$_3$ as elastic waves, spurious waves of Rayleigh waves appears around 0.76 times of the resonant frequency. In addition, in a higher frequency range than the antiresonance point of each elastic wave resonator (high frequencies 4 in FIG. 17A), an impedance change due to bulk wave leakage (unnecessary waves) appears, and whether the reflection characteristics are high or low depends on the impedance change.

FIG. 17B is a table showing combinations of configurations of the first band elimination filter 11B and second band elimination filter 12B according to the fifth alternative preferred embodiment to the fourth preferred embodiment.

Based on the ranking of the reflection coefficient, when the third frequency band that is the pass band of the series connection circuit defined by the first band elimination filter 11B and the second band elimination filter 12B lies between the pass band of the first filter 11A (first frequency band) and the pass band of the second filter 12A (second frequency band) (for example, in the case of the radio-frequency front-end circuit 1B according to the second preferred embodiment), the first band elimination filter 11B may have a structure that uses Rayleigh waves that propagate through a piezoelectric layer made of LiNbO$_3$ as surface acoustic waves, and the second band elimination filter 12B may have the above-described acoustic velocity film multilayer structure, as shown in FIG. 17B. Thus, the binding loss of the first filter 11A or the second filter 12A is reduced.

Alternatively, as shown in FIG. 17B, the first band elimination filter 11B may have any one of (1) a structure that uses Rayleigh waves that propagate through a piezoelectric layer made of LiNbO$_3$ as surface acoustic waves and (2) the above-described acoustic velocity film multilayer structure, and the second band elimination filter 12B may have a structure that uses leaky waves that propagate through a piezoelectric layer made of LiTaO$_3$ as surface acoustic waves. Thus, the binding loss of the first filter 11A or the second filter 12A is reduced.

When the second band elimination filter 12B is connected in a preceding stage (on the antenna common terminal 100 side) and the first band elimination filter 11B is connected in a subsequent stage (on the input-output terminal 120 side), the second band elimination filter 12B may have a structure that uses Rayleigh waves that propagate through a piezoelectric layer made of LiNbO$_3$ as surface acoustic waves, and the first band elimination filter 11B may have the above-described acoustic velocity film multilayer structure. Thus, the binding loss of the first filter 11A or the second filter 12A is reduced.

FIG. 18A is a view illustrating reflection characteristics at low frequencies 5 and a higher mode that appears at high frequencies 5 of each band elimination filter according to a sixth alternative preferred embodiment to the fourth preferred embodiment. As shown at the bottom of the drawing, in a lower frequency range than the resonance point (low frequencies 5 in FIG. 18A), the impedance varies with the structure of each elastic wave resonator, and whether the reflection characteristics are high or low depends on the magnitude of the impedance. In addition, in a higher frequency range than the resonance point of each elastic wave resonator (high frequencies 5 in FIG. 18A), particularly, in a structure that uses Rayleigh waves that propagate through a piezoelectric layer made of LiNbO$_3$ as surface acoustic waves or a structure that uses Love waves that propagate through a piezoelectric layer made of LiNbO$_3$ as surface acoustic waves, a higher mode appears around 1.2 times of the resonant frequency.

FIG. 18B is a table showing combinations of configurations of the first band elimination filter 11B and second band elimination filter 12B according to the sixth alternative preferred embodiment to the fourth preferred embodiment.

Based on the ranking of the reflection coefficient, when the third frequency band that is the pass band of the series connection circuit defined by the first band elimination filter 11B and the second band elimination filter 12B lies between the pass band of the first filter 11A (first frequency band) and the pass band of the second filter 12A (second frequency band) (for example, in the case of the radio-frequency front-end circuit 1B according to the second preferred embodiment), the first band elimination filter 11B may have any one of (1) the above-described acoustic velocity film multilayer structure, (2) a structure that uses leaky waves that propagate through a piezoelectric layer made of LiTaO$_3$ as surface acoustic waves, and (3) a structure that uses Love waves that propagate through a piezoelectric layer made of LiNbO$_3$ as surface acoustic waves, and the second band elimination filter 12B may have a structure that uses Rayleigh waves that propagate through a piezoelectric layer made of LiNbO$_3$ as surface acoustic waves, as shown in FIG. 18B. Thus, the binding loss of the first filter 11A or the second filter 12A is reduced or prevented.

Alternatively, as shown in FIG. 18B, the first band elimination filter 11B may have any one of (1) a structure that uses Rayleigh waves that propagate through a piezoelectric layer made of LiNbO$_3$ as surface acoustic waves, (2) the above-described acoustic velocity film multilayer structure, and (3) a structure that uses leaky waves that propagate through a piezoelectric layer made of LiTaO$_3$ as surface acoustic waves, and the second band elimination filter 12B may have a structure that uses Love waves that propagate through a piezoelectric layer made of LiNbO₃ as surface acoustic waves. Thus, the binding loss of the first filter 11A or the second filter 12A is reduced or prevented.

When the second band elimination filter 12B is connected in a preceding stage (on the antenna common terminal 100 side) and the first band elimination filter 11B is connected in a subsequent stage (on the input-output terminal 120 side), the second band elimination filter 12B may have any one of (1) the above-described acoustic velocity film multilayer structure, (2) a structure that uses leaky waves that propagate through a piezoelectric layer made of LiTaO₃ as surface acoustic waves, and (3) a structure that uses Love waves that propagate through a piezoelectric layer made of LiNbO₃ as surface acoustic waves, and the first band elimination filter 11B may have a structure that uses Rayleigh waves that propagate through a piezoelectric layer made of LiNbO₃ as surface acoustic waves. Thus, the binding loss of the first filter 11A or the second filter 12A is reduced or prevented.

FIG. 19A is a graph showing deterioration of return loss due to a higher mode of each band elimination filter according to the fourth preferred embodiment. As shown in the graph, the return loss of the first band elimination filter 11B when viewed from the antenna common terminal 100 increases in a higher frequency range than the resonance point (dashed-line region in FIG. 19A) because of a higher mode. Frequencies at which the return loss increases because of a higher mode can be shifted toward the higher frequency side or the lower frequency side by changing the structure parameters of each elastic wave resonator. Alternatively, an increase in return loss due to a higher mode can be reduced or prevented by changing the structure parameters of each elastic wave resonator.

From this viewpoint, the inventors of the present invention discovered that, in the first band elimination filter 11B that has a major unexpected effect on reflection characteristics, frequencies at which a higher mode, spurious waves, or the like, appears are shifted to the outside of the pass band of the second filter 12A by changing structure parameters and, in the second band elimination filter 12B that has a minor effect on reflection characteristics, structure parameters are improved or optimized to ensure filter characteristics, such as attenuation characteristics, temperature characteristics, and stop band width.

FIG. 19B is a table showing parameters that vary the structures of the first band elimination filter 11B and second band elimination filter 12B according to a seventh alternative preferred embodiment to the fourth preferred embodiment.

Each elastic wave resonator of the first band elimination filter 11B is a surface acoustic wave resonator defined by the substrate 80 including the piezoelectric layer 83, and the IDT electrode 71 provided on the substrate. As shown in FIG. 19B, each of the first band elimination filter 11B and the second band elimination filter 12B uses leaky waves that propagate through a piezoelectric layer made of LiTaO₃ as surface acoustic waves, and the IDT electrode 71 of the first band elimination filter 11B and the IDT electrode 71 of the second band elimination filter 12B have different electrode film thicknesses or different duties.

When leaky waves on LiTaO₃ are used as elastic waves, spurious of Rayleigh waves appears at lower frequencies than the resonant frequency of the elastic wave resonator. In contrast to this, when the first band elimination filter 11B and the second band elimination filter 12B have different electrode film thicknesses or different duties of the IDT electrodes 71, frequencies at which spurious waves of Rayleigh waves appears in the first band elimination filter 11B can be shifted to the outside of the second frequency band (the pass band of the lower frequency-side second filter 12A). Thus, the reflection coefficient of the first band elimination filter 11B in the second frequency band is increased, so the binding loss of the second filter 12A is reduced.

Alternatively, as shown in FIG. 19B, in each of the first band elimination filter 11B and the second band elimination filter 12B, each elastic wave resonator may have the above-described acoustic velocity film multilayer structure, and the first band elimination filter 11B and the second band elimination filter 12B may have different electrode film thicknesses of the IDT electrodes 71, different duties of the IDT electrodes 71, or different film thicknesses of the low acoustic velocity films 82.

When the acoustic velocity film multilayer structure is provided, spurious waves of Rayleigh waves appear at lower frequencies than the resonant frequency of the elastic wave resonator. In contrast to this, when the first band elimination filter 11B and the second band elimination filter 12B have different electrode film thicknesses or different duties of the IDT electrodes 71, frequencies at which spurious of Rayleigh waves appears in the first band elimination filter 11B can be shifted to the outside of the second frequency band (the pass band of the lower frequency-side second filter 12A). Thus, the reflection coefficient of the first band elimination filter 11B in the second frequency band is increased, so the binding loss of the second filter 12A is reduced.

FIG. 19C is a table showing parameters that vary the structures of the first band elimination filter 11B and second band elimination filter 12B according to an eighth alternative preferred embodiment to the fourth preferred embodiment.

Each of the elastic wave resonators that define the first band elimination filter 11B and the second band elimination filter 12B is a surface acoustic wave resonator defined by the substrate including the piezoelectric layer 83, the IDT electrode 71 provided on the substrate, and the protective film 84 provided on the IDT electrode 71. As shown in FIG. 19C, each of the first band elimination filter 11B and the second band elimination filter 12B uses Rayleigh waves that propagate through a piezoelectric layer made of LiNbO₃ or Love waves that propagate through a piezoelectric layer made of LiNbO₃ as surface acoustic waves, and the first band elimination filter 11B and the second band elimination filter 12B have different electrode film thicknesses of the IDT electrodes 71, different duties of the IDT electrodes 71, or different film thicknesses of the protective films 84.

When Rayleigh waves on LiNbO₃ or Love waves on LiNbO₃ are used as surface acoustic waves, a higher mode appears at higher frequencies than the resonant frequency of each elastic wave resonator. In contrast to this, when the first band elimination filter 11B and the second band elimination filter 12B have different electrode film thicknesses of the IDT electrodes 71, different duties of the IDT electrodes 71, or different film thicknesses of the low acoustic velocity films 82, frequencies at which a higher mode appears in the first band elimination filter 11B can be shifted to the outside of the second frequency band (the pass band of the higher frequency-side second filter 12A). Thus, the reflection coefficient of the first band elimination filter 11B in the second frequency band is increased, so the binding loss of the second filter 12A is reduced.

Alternatively, as shown in FIG. 19C, in each of the first band elimination filter 11B and the second band elimination filter 12B, each elastic wave resonator may have the above-described acoustic velocity film multilayer structure, the high acoustic velocity support substrate 81 may be made of silicon crystal, and the first band elimination filter 11B and the second band elimination filter 12B may have different film thicknesses of the piezoelectric layers 83, different film thicknesses of the low acoustic velocity films 82, or different silicon crystal orientations of the high acoustic velocity support substrates 81.

When the acoustic velocity film multilayer structure is provided, a higher mode appears at higher frequencies than the resonant frequency of each elastic wave resonator. In contrast to this, when the first band elimination filter 11B and the second band elimination filter 12B have different film thicknesses of the piezoelectric layers 83, different film thicknesses of the low acoustic velocity films 82, or different silicon crystal orientations of the high acoustic velocity support substrates 81, frequencies at which a higher mode appears in the first band elimination filter 11B can be shifted to the outside of the second frequency band (the pass band of the higher frequency-side second filter 12A). Thus, the reflection coefficient of the first band elimination filter 11B in the second frequency band is increased, so the binding loss of the second filter 12A is reduced.

FIG. 20 is a table showing parameters that vary the structures of the first band elimination filter 11B and second band elimination filter 12B according to a ninth alternative preferred embodiment to the fourth preferred embodiment.

Each of the elastic wave resonators that define the first band elimination filter 11B and the second band elimination filter 12B is a surface acoustic wave resonator defined by the substrate 80 including the piezoelectric layer 83, and the IDT electrode 71 provided on the substrate. Each of the first band elimination filter 11B and the second band elimination filter 12B uses leaky waves that propagate through a piezoelectric layer made of LiTaO$_3$ or Love waves that propagate through a piezoelectric layer made of LiNbO$_3$ as surface acoustic waves, and the first band elimination filter 11B and the second band elimination filter 12B have different electrode film thicknesses of the IDT electrodes 71.

When leaky waves on LiTaO$_3$ or Love waves on LiNbO$_3$ are used as surface acoustic waves, bulk waves (unnecessary waves) appear at higher frequencies than the resonant frequency of each elastic wave resonator. In contrast to this, when the first band elimination filter 11B and the second band elimination filter 12B have different electrode film thicknesses of the IDT electrodes 71, frequencies at which bulk waves appear in the first band elimination filter 11B can be shifted to the outside of the second frequency band (the pass band of the higher frequency-side second filter 12A). Thus, the reflection coefficient of the first band elimination filter 11B in the second frequency band is increased, so the binding loss of the second filter 12A is reduced.

Other Alternative Preferred Embodiments

The radio-frequency front-end circuits and the communication devices according to various preferred embodiments of the present invention are described above with reference to example preferred embodiments and their alternative preferred embodiments; however, the present invention also encompasses other preferred embodiments implemented by combining selected elements of the above-described preferred embodiments, alternative preferred embodiments obtained by applying various modifications that are conceived of by persons skilled in the art to the above-described preferred embodiments without departing from the principles of the present invention, and various devices that include the radio-frequency front-end circuits or the communication devices according to preferred embodiments of the present invention and modifications thereof.

For example, in the radio-frequency front-end circuit or the communication device, an inductor or a capacitor may be further connected between terminals, such as, for example, the input-output terminals and the antenna common terminal, or a circuit element other than an inductor or a capacitor, such as, for example, a resistor, may be added between the terminals.

Preferred embodiments of the present invention and modifications thereof are widely usable in communication equipment, such as, for example, cellular phones, as a low-loss, small-sized, and low-cost radio-frequency front-end circuits and communication devices that are applicable to multiband and multimode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency front-end circuit comprising:
    an antenna common terminal connected to an antenna element;
    a first input-output terminal, a second input-output terminal, and a third input-output terminal;
    a first filter connected between the antenna common terminal and the first input-output terminal, the first filter having a frequency band, including a first frequency band, as a pass band;
    a second filter connected between the antenna common terminal and the second input-output terminal, the second filter having a frequency band, including a second frequency band different from the first frequency band, as a pass band;
    a first band elimination filter connected between the antenna common terminal and the third input-output terminal, the first band elimination filter having a frequency band, including the first frequency band and not including a third frequency band different from the first frequency band or the second frequency band, as a stop band; and
    a second band elimination filter connected in series with the first band elimination filter between the antenna common terminal and the third input-output terminal, the second band elimination filter having a frequency band, including the second frequency band and not including the third frequency band, as a stop band; wherein
    the first filter is connected to the antenna common terminal and the first input-output terminal, but not connected to the antenna common terminal by the first band elimination filter or the second band elimination filter;
    the second filter is connected to the antenna common terminal and the second input-output terminal, but not connected to the antenna common terminal by the first band elimination filter or the second band elimination filter;
    the first band elimination filter and the second band elimination filter are connected in order of the antenna common terminal, the first band elimination filter, the second band elimination filter, and the third input-output terminal; and a reflection coefficient of the first band elimination filter in the first frequency band when the first band elimination filter is viewed from the antenna common terminal side alone is larger than a reflection coefficient of the second band elimination filter in the second frequency band when the second band elimination filter is viewed from the antenna common terminal side alone.

2. The radio-frequency front-end circuit according to claim 1, wherein the first filter and the first band elimination filter are provided in a same chip; and
the second filter and the second band elimination filter are provided in a same chip.

3. The radio-frequency front-end circuit according to claim 2, wherein the first filter and the first band elimination filter are provided in a first chip;
the second filter and the second band elimination filter are provided in a second chip;
the first filter, the first band elimination filter, the second filter, and the second band elimination filter each include one or more elastic wave resonators;
the first chip is defined by only one of a surface acoustic wave filter and an elastic wave filter using bulk acoustic waves (BAW); and
the second chip is defined by only one of a surface acoustic wave filter and an elastic wave filter using BAW.

4. The radio-frequency front-end circuit according to claim 1, wherein in ascending order of frequency, the third frequency band, the first frequency band, and the second frequency band are allocated; and
the first band elimination filter and the second band elimination filter define a low pass filter having a frequency band, including the third frequency band, as a pass band.

5. The radio-frequency front-end circuit according to claim 4, wherein
the third frequency band is a middle low band with a frequency between about 1475.9 MHz about 2025 MHz;
the first frequency band is a middle band with a frequency between about 2110 MHz —about 2200 MHz;
the second frequency band is a high band with a frequency between about 2496 MHz —about 2690 MHz;
the first filter is a band pass filter having a reception band of about 2110 MHz about 2200 MHz of long term evolution (LTE) as a pass band;
the second filter is a band pass filter having a reception band of about 2496 MHz —about 2690 MHz of LTE as a pass band; and
the first band elimination filter and the second band elimination filter define a low pass filter having a reception band of about 1805 MHz —about 1880 MHz as a pass band.

6. The radio-frequency front-end circuit according to claim 1, wherein
the third frequency band is located at lower frequencies than the first frequency band and the second frequency band;
each of the first band elimination filter and the second band elimination filter includes one or more elastic wave resonators; and
the first band elimination filter has a structure such that: (1) Rayleigh waves that propagate through a piezoelectric layer made of $LiNbO_3$ are used as surface acoustic waves, (2) each elastic wave resonator is a solidly mounted resonator (SMR), or (3) each elastic wave resonator is a film bulk acoustic resonator (FBAR).

7. The radio-frequency front-end circuit according to claim 6, wherein
the second band elimination filter has a structure such that: (1) each elastic wave resonator includes an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (2) leaky waves that propagate through a piezoelectric layer made of $LiTaO_3$ are used as surface acoustic waves, or (3) Love waves that propagate through a piezoelectric layer made of $LiNbO_3$ are used as surface acoustic waves.

8. The radio-frequency front-end circuit according to claim 1, wherein
the third frequency band is located at lower frequencies than the first frequency band and the second frequency band;
each of the first band elimination filter and the second band elimination filter includes one or more elastic wave resonators;
each of the elastic wave resonators that define each of the first band elimination filter and the second band elimination filter is a surface acoustic wave resonator defined by a substrate including a piezoelectric layer, and an IDT electrode provided on the substrate;
each elastic wave resonator of the first band elimination filter includes an acoustic velocity film multilayer structure defined by the piezoelectric layer on one of principal surfaces of which the IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer; and
the second band elimination filter has a structure such that: (1) leaky waves that propagate through the piezoelectric layer made of $LiTaO_3$ are used as surface acoustic waves, or (2) Love waves that propagate through the piezoelectric layer made of $LiNbO_3$ are used as surface acoustic waves.

9. The radio-frequency front-end circuit according to claim 1, wherein
the third frequency band is located at lower frequencies than the first frequency band and the second frequency band;
each of the first band elimination filter and the second band elimination filter includes one or more elastic wave resonators;
each of the elastic wave resonators that define each of the first band elimination filter and the second band elimination filter is a surface acoustic wave resonator defined by a substrate including a piezoelectric layer, and an IDT electrode provided on the substrate;
the first band elimination filter uses leaky waves that propagate through the piezoelectric layer made of $LiTaO_3$ as surface acoustic waves; and the second band elimination filter uses Love waves that propagate through the piezoelectric layer made of LiNbO$_3$ as surface acoustic waves.

10. The radio-frequency front-end circuit according to claim 1, wherein
the third frequency band is located at lower frequencies than the first frequency band and the second frequency band;
each of the first band elimination filter and the second band elimination filter includes one or more elastic wave resonators;
the first band elimination filter has a structure such that: (1) each elastic wave resonator includes an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (2) leaky waves that propagate through a piezoelectric layer made of LiTaO$_3$ are used as surface acoustic waves, (3) Love waves that propagate through a piezoelectric layer made of LiNbO$_3$ are used as surface acoustic waves, (4) each elastic wave resonator is an SMR, or (5) each elastic wave resonator is an FBAR; and
the second band elimination filter uses Rayleigh waves that propagate through a piezoelectric layer made of LiNbO$_3$ as surface acoustic waves.

11. The radio-frequency front-end circuit according to claim 1, wherein
the third frequency band is located at lower frequencies than the first frequency band and the second frequency band;
each of the first band elimination filter and the second band elimination filter includes one or more elastic wave resonators;
the first band elimination filter has a structure such that: (1) Rayleigh waves that propagate through a piezoelectric layer made of LiNbO$_3$ are used as surface acoustic waves, (2) each elastic wave resonator includes an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (3) leaky waves that propagate through a piezoelectric layer made of LiTaO$_3$ are used as surface acoustic waves, (4) each elastic wave resonator is an SMR, or (5) each elastic wave resonator is an FBAR; and
the second band elimination filter uses Love waves that propagate through a piezoelectric layer made of LiNbO$_3$ as surface acoustic waves.

12. The radio-frequency front-end circuit according to claim 1, wherein in ascending order of frequency, the first frequency band, the third frequency band, and the second frequency band are allocated; and
each of the first band elimination filter and the second band elimination filter has a frequency band, including the third frequency band, as a pass band.

13. The radio-frequency front-end circuit according to claim 12, wherein
the first frequency band is a middle band of about 2110 MHz —about 2200 MHz;
the third frequency band is a middle high band of about 2300 MHz —about 2400 MHz;
the second frequency band is a high band of about 2496 MHz —2690 MHz;
the first filter is a band pass filter with a reception band of about 2110 MHz —about 2200 MHz of Long Term Evolution (LTE) as a pass band;
the second filter is a band pass filter with a reception band of about 2496 MHz —about 2690 MHz of LTE as a pass band; and
each of the first band elimination filter and the second band elimination filter is a band pass filter with a reception band of about 2300 MHz —about 2400 MHz as a pass band.

14. The radio-frequency front-end circuit according to claim 1, wherein
in ascending order of frequency, the first frequency band, the second frequency band, and the third frequency band are allocated; and
the first band elimination filter and the second band elimination filter define a high pass filter having a frequency band, including the third frequency band, as a pass band.

15. The radio-frequency front-end circuit according to claim 14, wherein
the third frequency band is an ultra high band of about 3400 MHz —about 3800 MHz;
the first frequency band is a middle band of about 2110 MHz —about 2200 MHz;
the second frequency band is a high band of about 2496 MHz —about 2690 MHz;
the first filter is a band pass filter having a reception band of about 2110 MHz —about 2200 MHz of a Long Term Evolution (LTE) as a pass band;
the second filter is a band pass filter having a reception band of about 2496 MHz —about 2690 MHz of LTE as a pass band; and
each of the first band elimination filter and the second band elimination filter is a high pass filter having a reception band of about 3400 MHz —about 3600 MHz or a reception band of about 3600 MHz —about 3800 MHz or both as a pass band.

16. The radio-frequency front-end circuit according to claim 1, wherein
the third frequency band is located at higher frequencies than the first frequency band and the second frequency band;
is located at each of the first band elimination filter and the second band elimination filter includes one or more elastic wave resonators;
each of the one or more elastic wave resonators that define the first band elimination filter is a surface acoustic wave resonator, the surface acoustic wave resonator is defined by a substrate including a piezoelectric layer, and an IDT electrode provided on the substrate; and
the first band elimination filter has a structure that uses any one of (1) Rayleigh waves that propagate through the piezoelectric layer made of LiNbO₃, (2) leaky waves that propagate through the piezoelectric layer made of LiTaO₃, and (3) Love waves that propagate through the piezoelectric layer made of LiNbO₃, as surface acoustic waves.

17. The radio-frequency front-end circuit according to claim 16, wherein each elastic wave resonator of the second band elimination filter is an SMR or an FBAR.

18. The radio-frequency front-end circuit according to claim 1, wherein
the third frequency band is located at higher frequencies than the first frequency band and the second frequency band;
each of the first band elimination filter and the second band elimination filter includes one or more elastic wave resonators;
each of the one or more elastic wave resonators that define the first band elimination filter is a surface acoustic wave resonator, the surface acoustic wave resonator is defined by a substrate including a piezoelectric layer, and an IDT electrode provided on the substrate;
each elastic wave resonator of the first band elimination filter includes an acoustic velocity film multilayer structure defined by the piezoelectric layer on one of principal surfaces of which the IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer; and
each elastic wave resonator of the second band elimination filter is an SMR or an FBAR.

19. The radio-frequency front-end circuit according to claim 1, wherein
the third frequency band is located at higher frequencies than the first frequency band and the second frequency band;
each of the first band elimination filter and the second band elimination filter includes one or more elastic wave resonators;
the first band elimination filter has a structure such that: (1) Rayleigh waves that propagate through a piezoelectric layer made of LiNbO₃ are used as surface acoustic waves, (2) leaky waves that propagate through a piezoelectric layer made of LiTaO₃ are used as surface acoustic waves, (3) Love waves that propagate through a piezoelectric layer made of LiNbO₃ are used as surface acoustic waves, (4) each elastic wave resonator is an SMR, or (5) each elastic wave resonator is an FBAR; and
each elastic wave resonator of the second band elimination filter includes an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer.

20. The radio-frequency front-end circuit according to claim 1, wherein
the third frequency band is located at higher frequencies than the first frequency band and the second frequency band;
each of the first band elimination filter and the second band elimination filter includes one or more elastic wave resonators;
the first band elimination filter has a structure such that: (1) Rayleigh waves that propagate through a piezoelectric layer made of LiNbO₃ are used as surface acoustic waves, (2) Love waves that propagate through a piezoelectric layer made of LiNbO₃ are used as surface acoustic waves, (3) each elastic wave resonator includes an acoustic velocity film multilayer structure defined by a piezoelectric layer on one of principal surfaces of which an IDT electrode is provided, a high acoustic velocity support substrate through which bulk waves propagate at a higher acoustic velocity than elastic waves propagate through the piezoelectric layer, and a low acoustic velocity film disposed between the high acoustic velocity support substrate and the piezoelectric layer and through which bulk waves propagate at a lower acoustic velocity than elastic waves propagate through the piezoelectric layer, (4) each elastic wave resonator is an SMR, or (5) each elastic wave resonator is an FBAR; and
the second band elimination filter uses leaky waves that propagate through a piezoelectric layer made of LiTaO₃ as surface acoustic waves.

21. The radio-frequency front-end circuit according to claim 1, further comprising:
a first amplifier circuit connected to the first input-output terminal;
a second amplifier circuit connected to the second input-output terminal; and
a third amplifier circuit connected to the third input-output terminal.

22. A communication device comprising:
an RF signal processing circuit to process a radio-frequency signal that is transmitted or received by the antenna element; and
the radio-frequency front-end circuit according to claim 1 to transmit the radio-frequency signal between the antenna element and the RF signal processing circuit.

23. A radio-frequency front-end circuit comprising:
an antenna common terminal connected to an antenna element;
a first input-output terminal, a second input-output terminal, and a third input-output terminal;
a first filter connected between the antenna common terminal and the first input-output terminal, the first filter having a frequency band, including a first frequency band, as a pass band;
a second filter connected between the antenna common terminal and the second input-output terminal, the second filter having a frequency band, including a second frequency band different from the first frequency band, as a pass band;
a first band elimination filter connected between the antenna common terminal and the third input-output terminal, the first band elimination filter having a frequency band, including the first frequency band and not including a third frequency band different from the first frequency band or the second frequency band, as a stop band; and a second band elimination filter connected in series with the first band elimination filter between the antenna common terminal and the third input-output terminal, the second band elimination filter having a frequency band, including the second frequency band and not including the third frequency band, as a stop band; wherein the first filter is connected to the antenna common terminal and the first input-output terminal, but not connected to the antenna common terminal by the first band elimination filter or the second band elimination filter;

the second filter is connected to the antenna common terminal and the second input-output terminal, but not connected to the antenna common terminal by the first band elimination filter or the second band elimination filter;

the first band elimination filter and the second band elimination filter are connected in order of the antenna common terminal, the second band elimination filter, the first band elimination filter, and the third input-output terminal; and a reflection coefficient of the second band elimination filter in the second frequency band when the second band elimination filter is viewed from the antenna common terminal side alone is larger than a reflection coefficient of the first band elimination filter in the first frequency band when the first band elimination filter is viewed from the antenna common terminal side alone.

* * * * *